(12) United States Patent
Satoh et al.

(10) Patent No.: US 8,418,359 B2
(45) Date of Patent: Apr. 16, 2013

(54) METHOD FOR MANUFACTURING CIRCUIT PATTERN-PROVIDED SUBSTRATE

(75) Inventors: Ryohei Satoh, Osaka (JP); Koji Nakagawa, Tokyo (JP); Eiji Morinaga, Osaka (JP); Reo Usui, Osaka (JP); Kenji Tanaka, Tokyo (JP); Satoru Takaki, Tokyo (JP); Kenichi Ebata, Tokyo (JP); Hiroshi Sakamoto, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 680 days.

(21) Appl. No.: 12/364,314

(22) Filed: Feb. 2, 2009

(65) Prior Publication Data

US 2009/0205851 A1 Aug. 20, 2009

Related U.S. Application Data

(63) Continuation of application No. PCT/JP2007/065018, filed on Jul. 31, 2007.

(30) Foreign Application Priority Data

Aug. 2, 2006 (JP) ................ P.2006-210835
Jul. 25, 2007 (JP) ................ P.2007-193567

(51) Int. Cl.
*H05K 3/02* (2006.01)
*H05K 3/10* (2006.01)

(52) U.S. Cl.
USPC ............. 29/846; 29/825; 29/829; 29/831; 438/737

(58) Field of Classification Search .............. 29/846, 29/825, 829, 831; 428/220, 446, 687; 430/168, 430/287.1, 312, 322, 324, 325; 438/737
See application file for complete search history.

(56) References Cited

U.S. PATENT DOCUMENTS 4,180,604 A * 12/1979 Feng et al. ............... 430/168
5,736,298 A * 4/1998 Koshimura et al. ........ 430/287.1
(Continued)

FOREIGN PATENT DOCUMENTS

| EP | 0 732 868 A1 | 9/1996 |
|----|--------------|--------|
| JP | 56-81954 | 7/1981 |

(Continued)

OTHER PUBLICATIONS

Office Action issued on Nov. 3, 2010, in European Patent Application No. 07 791 702.9.

*Primary Examiner* — Thiem Phan
(74) *Attorney, Agent, or Firm* — Oblon, Spivak, McClelland, Maier & Neustadt, L.L.P.

(57) ABSTRACT

A method for manufacturing a circuit pattern-provided substrate including forming a resist layer on a substrate, forming an opening corresponding to a circuit pattern and having an eaves cross-sectional shape in the resist layer, forming a thin film layer having a portion formed on the substrate in the opening and a portion formed on the resist layer, and removing the resist layer such that the resist layer and the portion of the thin film layer formed on the resist layer are removed from the substrate. The forming of the opening comprises exposing the resist layer with a mask device which changes an exposure amount of the resist layer such that the eaves cross-sectional shape has a space at a boundary between the resist layer and the substrate.

13 Claims, 12 Drawing Sheets

U.S. PATENT DOCUMENTS

| | | | |
|---|---|---|---|
| 7,033,679 B2 * | 4/2006 | Okura et al. | 428/687 |
| 7,259,106 B2 * | 8/2007 | Jain | 438/737 |
| 2001/0018160 A1 | 8/2001 | Ueda et al. | |
| 2003/0015494 A1 | 1/2003 | Jayashankar et al. | |
| 2006/0240338 A1 | 10/2006 | Satoh et al. | |
| 2007/0190886 A1 | 8/2007 | Satoh et al. | |

FOREIGN PATENT DOCUMENTS

| | | |
|---|---|---|
| JP | 1-236658 | 9/1989 |
| JP | 2989064 | 7/1993 |
| JP | 7-29846 | 1/1995 |
| JP | 7-168368 | 7/1995 |
| JP | 8-315981 | 11/1996 |
| JP | 9-211868 | 8/1997 |
| JP | 10-163095 | 6/1998 |
| JP | 3028094 | 8/1998 |
| JP | 11-24286 | 1/1999 |
| JP | 11-317418 | 11/1999 |
| JP | 11-339574 | 12/1999 |
| JP | 2002-134004 | 5/2002 |
| JP | 2003-131395 | 5/2003 |
| JP | 2003-287905 | 10/2003 |
| JP | 2006-58720 | 3/2006 |
| WO | WO 2006/035565 A1 | 4/2006 |

* cited by examiner (a)

(b)

(c)

(d)

(e)

(a)

(b)

METHOD FOR MANUFACTURING CIRCUIT PATTERN-PROVIDED SUBSTRATE

TECHNICAL FIELD

The present invention relates to a circuit pattern-provided substrate and a method for manufacturing the same.

BACKGROUND ART

A circuit pattern made of a thin film of a metal or an insulating material on a substrate has hitherto been used in every electronic circuits which are used in computers, communications, information home appliances, various display devices and the like. Further, in order to make it compatible with a rapidly progressing advanced information society, higher integration (realization of high definition) is demanded.

For the formation of such a circuit pattern, a method using a photolithography etching process has been generally adopted. A representative process of this method is illustrated in FIGS. 10 to 11. As illustrated in FIGS. 10 to 11, this method is a method in which after forming a thin film for forming a circuit pattern in at least a part of the surface of a substrate, a resist is coated and dried to form a resist layer. Then, by exposing the resist layer via a mask and developing it, a pattern (inverse circuit pattern) which is inverse to the circuit pattern is formed. Thereafter, a desired circuit pattern is formed through etching and removal of the resist layer. This method is excellent in view of mass productivity because precision of pattern formation is good, the same pattern can be reproduced over and over, and a plural number of electronic circuits can be formed on the same substrate.

However, as illustrated in FIGS. 10 to 11, this method using a photolithography etching process is a method in which a circuit pattern of an electronic circuit is accomplished by repeating a number of steps. According to the method illustrated in FIGS. 10 to 11, after forming a thin film layer 51 on a substrate 50 (FIG. 10(b)), a resist layer 52 is formed (FIG. 10(c)); exposure, development treatment, etching and peeling off of the resist layer 52 are carried out (FIGS. 10(d) to 10(e) and FIG. 11(a)); and furthermore, after forming an insulating layer 53 (FIG. 11(b)), formation of a resist layer 54, exposure, development, etching and peeling off of the resist layer 54 are carried out (FIGS. 11(c) to 11(e)).

That is, in this method, every time when forming a circuit pattern comprising a thin film layer and an insulating layer, a very large number of steps as many as 22 steps, which include film formation, resist coating, drying, exposure, development, etching, resist layer peeling off and the like, are required. For that reason, there was involved a problem that the manufacturing cost is very high. Furthermore, in this method, every time when performing the foregoing number of steps, a large amount of a developing solution, a chemical solution such as an etchant, etc. and a washing solution are used. This involved not only problems that the yield is low and the manufacturing cost is very high, but also involved a problem that an environmental load such as a treatment of waste fluid, an aspect of which is an important matter of concern nowadays, is very large.

Then, there has been proposed a lift-off method which has a small number of steps and gives a low environmental load as compared with the foregoing photography etching process (see, for example, Patent Documents 1 to 7).

In general, the lift-off method is a method in which an inverse circuit pattern is formed by a resist layer on a substrate; a thin film layer is formed on the surface of the substrate; and subsequently, the resist layer is peeled off, thereby forming a circuit pattern by the thin film layer in an opening of the resist layer. FIGS. 12 to 13 illustrate steps of forming an inverse circuit pattern of a resist layer by carrying out exposure, development and the like of the resist layer; and this illustrates steps of a wet lift-off method which is carried out under a so-called wet condition.

In the method illustrated in FIGS. 12 to 13, a resist layer 62 is formed on a substrate 61 (FIG. 12(b)); and a resist pattern is formed by exposure and development (FIGS. 12(c) to 12(d)). Thereafter, after forming a thin film layer 63, the unnecessary resist layer 62 and thin film layer 63 are peeled off (FIG. 12(e) and FIG. 13(a)). Furthermore, a resist layer 64 is again formed on the substrate 61, a resist pattern is formed by exposure and development, and an insulating layer 65 is formed (FIGS. 13(b) to 13(c)); and thereafter, the unnecessary resist layer 64 and insulating layer 65 are peeled off (FIG. 13(d)).

Then, in such a lift-off method, in order to form a desired fine pattern in high precision, a cross-sectional shape of the opening to be formed in the resist layer is important. There is proposed a method of forming a pattern in which the cross-sectional shape is specifically made into an inverse tapered shape, an overhang shape, a double-layer lamination type or a T-shape type (see Patent Documents 8 to 12).

Patent Document 1: Japanese Patent No. 2989064
Patent Document 2: Japanese Patent No. 3028094
Patent Document 3: JP-A-7-168368
Patent Document 4: JP-A-8-315981
Patent Document 5: JP-A-11-317418
Patent Document 6: JP-A-2002-134004
Patent Document 7: JP-A-11-339574
Patent Document 8: JP-A-56-81954
Patent Document 9: JP-A-1-236658
Patent Document 10: JP-A-7-29846
Patent Document 11: JP-A-2003-287905
Patent Document 12: JP-A-9-211868

DISCLOSURE OF THE INVENTION

Problems to be Solved by the Invention

However, even when an opening having such a cross-sectional shape is formed in a resist layer, a desired pattern could not be formed in high precision, and there was the case where at the time of peeling off the resist, a problem of film peeling in which a space or peeling is generated between the thin film layer that forms a pattern and the substrate is caused. Also, for example, when on a top face of a thin film layer formed for the purpose of serving as an electrode, a protective layer for the purpose of protecting it is formed, there was the case where an end (side face) of the thin film layer is exposed without being completely covered by the protective layer, and therefore, the thin film layer is deteriorated during a post-step, or disconnection is caused in an electronic circuit using it as an electrode or the like.

Means for Solving the Problems

The present inventors made extensive and intensive investigations regarding the mechanism which causes such phenomena that the pattern precision in the lift-off method is lowered or that a space or peeling is generated between the thin film layer that forms a pattern and the substrate. Then, it has been found that the foregoing problems can be solved by forming a cross-sectional shape of an opening to be formed in a resist layer into an eaves type and specifying its shape by the relationship with the thickness of the thin film layer to be formed, etc., thereby leading to the invention.

Specifically, the invention is concerned with the following (1) to (15).

(1) A method for manufacturing a circuit pattern-provided substrate, in which a desired circuit pattern comprising a thin film layer is formed on a substrate, which method includes: a resist layer forming step of forming a resist layer on the substrate; an opening forming step of forming an opening of a shape corresponding to a desired circuit pattern in the resist layer; a thin film layer forming step of forming a thin film layer on the substrate in the opening and on the resist layer; and a peeling-off step of peeling off the resist layer and the thin film layer formed on the resist layer from the substrate, wherein the opening formed in the resist layer by the opening forming step has a cross-sectional shape of an eaves type having a space with a height (h) and a width (w) at a boundary between the resist layer and the substrate, wherein the height (h) and the width (w) are determined such that when the thin film layer is formed in the thin film layer forming step, an end of the thin film layer formed on the substrate in the opening does not go up onto a foot of the resist layer.

(2) The method for manufacturing a circuit pattern-provided substrate according to (1) above, wherein among the plural openings formed in the resist layer, a gap ($2c$) between the adjacent openings to each other and a thickness (T) of the thin film layer formed on the substrate in the thin film layer forming step satisfy the relationships of $0.06 \times T \leq h \leq 0.67 \times (2c)$ and $h/4 < w \leq (2c)/6$.

(3) The method for manufacturing a circuit pattern-provided substrate according to (1) or (2) above, wherein the cross-sectional shape in the opening of the resist layer further has an inverse tapered shape.

(4) The method for manufacturing a circuit pattern-provided substrate according to (1), (2) or (3) above, wherein the opening forming step comprises a step of carrying out exposure and development so as to satisfy the relationship of $P < R < Q$, wherein P, Q and R represent exposure amounts to an opening forming site, an opening non-forming site and a boundary site, serving as a boundary region of these sites, in the resist layer, respectively.

(5) The method for manufacturing a circuit pattern-provided substrate according to (4) above, wherein the exposure is carried out so as to satisfy the relationship of $P < R < Q$ by using a mask which shields exposure light to the opening forming site and the boundary site and a mask which shields exposure light to the opening forming site.

(6) The method for manufacturing a circuit pattern-provided substrate according to (4) above, wherein the exposure is carried out so as to satisfy the relationship of $P < R < Q$ by using a mask which shields exposure light to the opening forming site and which semi-transmits exposure light to the boundary site.

(7) The method for manufacturing a circuit pattern-provided substrate according to (4) above, wherein the exposure is carried out so as to satisfy the relationship of $P < R < Q$ by using a mask which shields exposure light to the opening forming site and the boundary site and varying a distance between the mask and the resist layer.

(8) The method for manufacturing a circuit pattern-provided substrate according to (4) above, wherein the exposure is carried out so as to satisfy the relationship of $P < R < Q$ by using a mask which shields exposure light to the opening forming site and the boundary site, making a distance between this mask and the resist layer constant and exposing the boundary site by diffracted light and roundabout light generated in the periphery of a light-shielding part of the mask.

(9) The method for manufacturing a circuit pattern-provided substrate according to any one of (4) to (8) above, wherein the exposed resist layer is water washed with water containing from 0.0005 to 5% by mass of a monovalent, divalent or trivalent cation.

(10) The method for manufacturing a circuit pattern-provided substrate according to any one of (1) to (9) above, wherein the thin film layer of the circuit pattern comprises an electrode layer containing at least one member selected from the group consisting of Cu, Al, Ag and Ni as a major component, or an electrode layer containing at least one member selected from the group consisting of $SnO_2$, ITO and ZnO as a major component.

(11) The method for manufacturing a circuit pattern-provided substrate according to (10) above, wherein the thin film layer of the circuit pattern comprises three or more layers; the electrode layer is a layer containing Cu as a major component; and the thin film layer includes a layer containing Cr and/or Ti as a major component on each of a top face and a bottom face of the electrode layer containing Cu as a major component.

(12) The method for manufacturing a circuit pattern-provided substrate according to any one of (1) to (11) above, comprising a protective layer forming step of forming a protective layer for covering a top face and a side face of the thin film layer of the circuit pattern, wherein the protective layer comprises a layer containing at least one member selected from the group consisting of $SiO_2$, $TiO_2$, $ZrO_2$, $Ta_2O_5$, $Cr_2O_3$ and $SnO_2$ as a major component.

(13) A circuit pattern-provided substrate manufactured by the method for manufacturing a circuit pattern-provided substrate according to any one of (1) to (12) above.

(14) A PDP front substrate manufactured by the method for manufacturing a circuit pattern-provided substrate according to any one of (1) to (12) above.

(15) A plasma display panel comprising the PDP front substrate according to (14) above.

Advantageous Effects of the Invention

According to the invention, it is possible to provide a method for manufacturing a circuit pattern-provided substrate capable of forming a desired fine circuit pattern in higher precision.

Also, for example, in the case where on a top face of a thin film layer formed for the purpose of serving as an electrode, a protective layer for the purpose of protecting the thin film is formed, the protective layer can cover the thin film layer without causing exposure of an end (side face) of the thin film layer; and for example, in the case where the patterned thin film layer is used as an electrode, disconnection is hardly caused in an electronic circuit, etc. using it.

DESCRIPTION OF REFERENCE NUMERALS AND SIGNS

Figure 1:
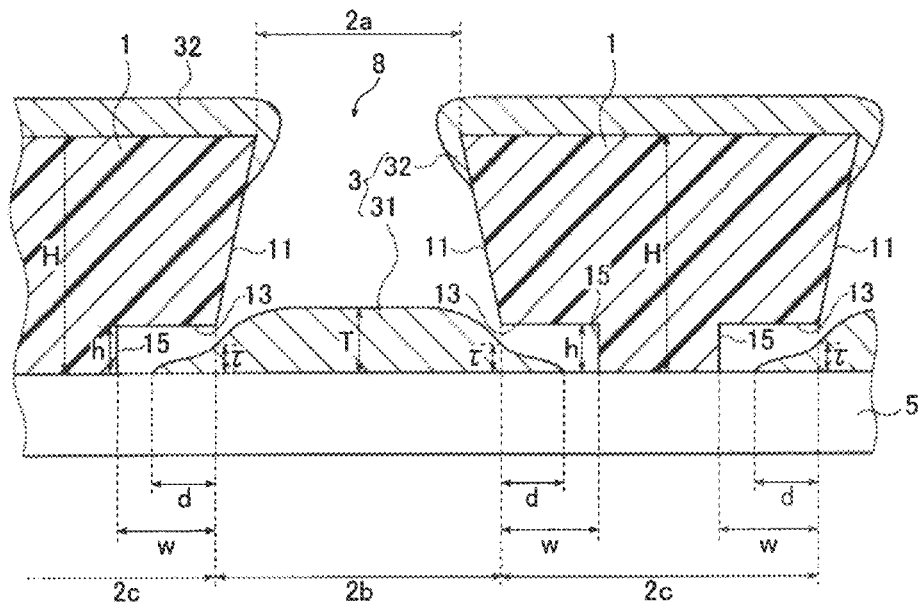
FIG. 1 is a diagrammatic cross-sectional view for explaining a resist opening in the method for manufacturing a circuit pattern-provided substrate of the invention.

1: Resist layer
11: Resist end face
13: Eaves bottom face
15: Wall
3, 31, 32: Thin film layer
5: Substrate
8: Opening
w: Width of eaves type space
h: Height of eaves type space
d: Incursion distance of thin film into resist interstice
2a: Opening size
2b: Width (horizontal distance)
2c: Width (horizontal distance)
T: Thickness at the central part of thin film layer
H: Resist thickness
τ: Thickness of thin film at inlet of resist interstice
20: Substrate
22, 22': Resist layer
26, 27, 28, 29: Exposure light
29': Diffracted exposure light
40: Mask
40a: Complete light-shielding part
40b: Complete transmission part
42: Mask
42a: Complete light-shielding part
42b: Complete transmission part
44: Mask
44a: Complete light-shielding part
44b: Semi-transmission part
44c: Complete transmission part
46, 46': Mask
46a, 46'a: Complete light-shielding part
46b, 46'b: Complete transmission part
J: Opening forming site
K: Boundary site
L: Opening non-forming site
50: Substrate
51: Thin film layer
52, 54: Resist layer
53: Insulating layer
61: Substrate
62, 64: Resist layer
63: Thin film layer
65: Insulating layer
71: Substrate
72: Resist layer
721: Foot of resist layer
73, 731, 732: Thin film layer
733: Incursion portion
734: Side face
735, 736: Portion in the vicinity of end of thin film layer
75: Protective layer
80: Glass substrate
81: $Cr_2O_3$ layer
82, 84: Cr layer
83: Cu layer
85: $SnO_2$ layer
86: Dielectric layer
87: Glass substrate
88: $Cr_2O_3$ layer
89, 91: Cr layer
90: Cu layer
92: $SnO_2$ layer
93: Dielectric layer
94: Contact seal material
95: Glass opposing substrate
B-a: Dielectric covered portion
B-b: Dielectric non-covered portion
100: Substrate
101: Low-reflection layer
102, 104: Adhesive layer containing Cr as a major component
103: Adhesive layer containing Cu as a major component
105: Resist layer
106, 107: Protective layer
110: Substrate
111: Low-reflection layer
112, 114: Adhesive layer containing Cr as a major component
113: Adhesive layer containing Cu as a major component
115: Protective layer
116: Light-shielding mask for laser patterning
117: Laser light

BEST MODE FOR CARRYING OUT THE INVENTION

The invention is hereunder described.

The manufacturing method of the invention is a method for manufacturing a circuit pattern-provided substrate for forming a desired circuit pattern comprising a thin film layer on a substrate, which method includes: a resist layer forming step of forming a resist layer on the substrate; an opening forming step of forming an opening of a shape corresponding to a desired circuit pattern in the resist layer; a thin film layer forming step of forming a thin film layer on the substrate in the opening and on the resist layer; and a peeling-off step of peeling off the resist layer and the thin film layer formed on the resist layer from the substrate.

<Resist Layer Forming Step>

First of all, the resist layer forming step in the manufacturing method of the invention is described.

In the manufacturing method of the invention, the resist layer forming step is a step of forming a resist layer on a substrate. Here, the substrate is not particularly limited, and it is preferably a transparent substrate such as glass, and more preferably a glass substrate. Also, its thickness and size are not particularly limited. For example, so far as the substrate is a glass substrate having a plate thickness of from about 1 to 3 mm, the circuit pattern-provided substrate which is manufactured by the manufacturing method of the invention can be preferably used as a front or rear substrate of a plasma display panel (hereinafter also referred to as "PDP").

Also, a resist material to be used for forming the resist layer is not particularly limited so far as it is a negative working resist material, and materials similar to those used in a usual lift-off method can be used.

For example, a phenolic hydroxyl group-containing polymer or a material obtained by adding an aromatic azide compound to the polymer is used. Examples of the phenolic hydroxyl group-containing polymer include polyhydroxystyrenes, addition condensates of a phenol or a cresol and an aldehyde, polyhydroxybenzal, polyisopropenylphenol, etc. Examples of the aromatic azide compound include 4,4'-diazidodiphenyl sulfide, 4,4'-diazidodiphenylsulfone, 3,3'-diazidodiphenylsulfone, 4,4'-diazidodiphenylmethane, 3,3'-dichloro-4,4'-diazidodiphenylmethane, 4,4'-diazidodiphenyl ether, 4,4'-diazidodibenzyl, etc. Furthermore, examples of photoresist include, for example, a material containing chloromethylated poly($\alpha$-methylstyrene) as a major component, a combination of an alkali-soluble polyvinylphenol and azidochalcone, a combination of an alkali-soluble polyvinylphenol and a condensate of azidocinnamaldehyde and isophorone, a combination of an alkali-soluble polyvinylphenol and azidophenylsulfone, a combination of an alkali-soluble novolak resin and quinone diazide, a combination of an alkali-soluble novolak resin, a compound capable of generating an acid by light and a compound capable of forming crosslinking by an acid, a combination of a cresol novolak resin, a triazine compound and an alkoxymethylated urea, a combination of a hydroxystyrene polymer or copolymer or a partial modification thereof, a triazine compound and an alkoxymethylated amino resin, etc.

Also, the resist material can contain usually employed additives, for example, a thermosetting resin, a sensitizer, a plasticizer, a stabilizer, a surfactant or a dye. The content thereof is not particularly limited, and may be a usually employed degree.

A method of forming a resist layer on one of main planes of the substrate using such a resist material is not particularly limited, and the resist layer can be formed by a usual method, for example, by dissolving the resist material in an appropriate solvent, coating the solution on the substrate and then removing the solvent. Also, the resist layer can be formed by laminating a sheet-shaped resist onto the substrate. A preferred method of forming an opening in the resist layer is described in the description of an opening forming step set forth below.

Also, the thickness H of the thus formed resin layer is not particularly limited but can be properly controlled depending upon the thickness of the thin film layer or protective layer to be formed or the like. The thickness H is preferably from 2 to 40 μm, and more preferably from 10 to 30 μm. When the resist layer is too thin as compared with the thin film layer or the like, the peeling off of the resist layer and the thin film layer formed on the top face thereof at the time of the peeling-off step becomes difficult, whereby there is a concern that a desired pattern is not obtained. When the resist layer is too thick, there is a concern that desired patterning precision is not obtained. The term "thickness H of the resist layer" hereinafter referred to means an average thickness of the resist layer before the formation of an opening.

It is preferable that the material of the resist material and conditions for exposure and development are chosen taking into consideration a photosensitive threshold to the exposure, a dissolution rate in a developing solution and adhesion to the substrate. The resist layer may be a resist layer composed of a single layer, or may be a resist layer composed of two or more layers.

<Opening Forming Step>

Next, the opening forming step in the manufacturing method of the invention is described.

In the manufacturing step of the invention, the opening forming step is a step of forming an opening of a shape corresponding to a desired circuit pattern in the resist layer. The opening of the resist layer which is formed by this step has a cross-sectional shape of an eaves type having a space with a height h and a width w at a boundary between the resist layer and the substrate.

The cross-sectional shape in the opening of the resist layer is described in detail with reference to FIG. 1. FIG. 1 is a view illustrating a cross section of a substrate 5 having a resist layer 1 in which an opening having a cross-sectional shape of an eaves type is formed and a thin film layer 3 (one formed on a top face of the resist layer 1 is designated as a thin film layer 32, and one formed on a top face of the substrate 5 in an opening 8 is designated as a thin film layer 31), the substrate 5 being obtained through the resist layer forming step, the opening forming step and the thin film layer forming step in the manufacturing method of the invention.

As illustrated in FIG. 1, in the cross section in the opening 8 of the resist layer 1, a face facing on the substrate 5 in a face of the resist layer 1 coming into contact with the opening 8 (side face of the resist layer 1 defining the opening 8) is designated as an eaves bottom face 13. Further, a face which connects the eaves bottom face 13 and the substrate 5 to each other is designated as a wall 15. Further, a face which connects the eaves bottom face 13 and the top face of the resist layer 1 (the face of the resist layer 1 coming into contact with the thin film layer 32) to each other (this face being a side face of the resist layer 1 coming into contact with the opening 8 and a face other than the eaves bottom face 13 and the wall 15) is designated as a resist end face 11.

The height h of the space at the boundary between the resist layer 1 and the substrate 5 is defined as an average value of a distance between the eaves bottom face 13 and the substrate 5. Further, the width w of the space at the boundary between the resist layer 1 and the substrate 5 is defined as a horizontal distance between a boundary line of the resist end face 11 and the eaves bottom face 13 and a boundary line of the eaves bottom face 13 and the wall 15 (the direction parallel to the substrate 5 being defined to be horizontal). Accordingly, as illustrated in FIG. 1, in the case where the eaves bottom face 13 is parallel to the substrate 5, the width w is equal to the horizontal distance of the eaves bottom face 13.

Further, as illustrated in FIG. 1, a horizontal distance between a boundary line of the resist end face 11 and the eaves bottom face 13 and a separate similar boundary line adjacent thereto across the resist layer 1 is defined as an interval $2c$; and an opening size in the horizontal direction of the resist topmost face in the opening is defined as an opening size $2a$.

Further, the center in the horizontal direction of the opening 8 in the cross section as in FIG. 1 as referred to herein means a point where horizontal distances from ends of the topmost faces of the openings of the two resist layers 1 interposing the opening 8 therebetween are each a. Also, a point going down vertically to the thin film layer 31 from the center in the horizontal direction of the opening 8 is defined as a center of the thin film layer 31.

The thickness T of the thin film layer 31 means a thickness at the center of the thin film layer 31. Also, a length in the horizontal direction of the end of the thin film layer 31 which is an end of the thin film layer formed by incursion into the space between the eaves bottom face 13 and the substrate 5 (this length being a horizontal distance from the boundary of the eaves bottom face 13 and the resist end face 11 to a tip of this thin film layer closest to the wall 15) is defined as an incursion distance d of the thin film layer into the space. Here, as illustrated in FIG. 1, the distance d can be measured by observing a cross section of a product obtained through the resist layer forming step, the opening forming step and the thin film layer forming step in the manufacturing method of the invention by using a scanning electron microscope or the like. Besides, h, w, T, τ, $2a$, $2b$ and $2c$ can be similarly measured.

Since the cross-sectional shape of the opening is of a cross-sectional shape of an eaves type having the above-mentioned space, it is possible to prevent the end of the thin film layer formed on the substrate in the thin film layer forming step from going up onto the foot of the resist layer. According to this, not only a desired fine circuit pattern can be formed in high precision, but also a circuit pattern with high reliability is obtained.

Figure 14:
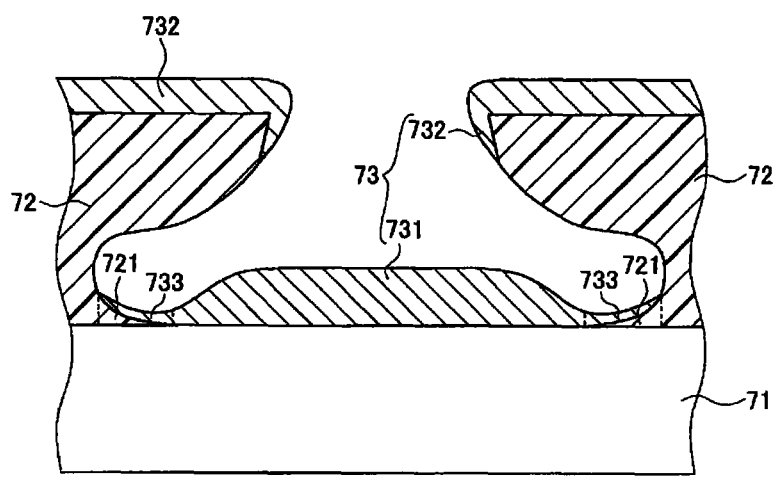
FIGS. 14(a) and 14(b) are each a cross-sectional view for explaining a thin film layer formed in a thin film layer forming step of a conventional method for manufacturing a circuit pattern-provided substrate.
Figure 14:
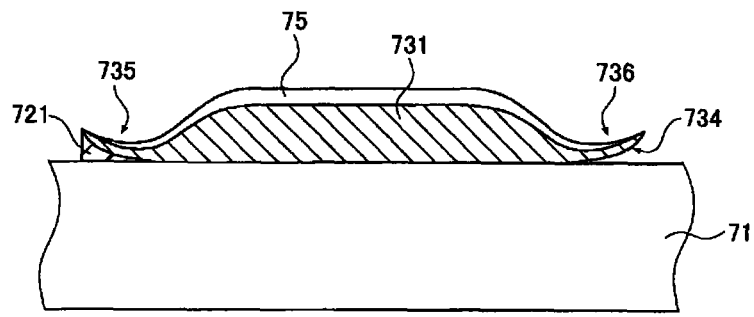

In the plural openings formed in the resist layer, when an interval between the adjacent openings to each other is defined as $2c$, and the thickness of the thin film layer on the substrate is defined as T, it is preferable that the width w and the height h of the space satisfy the relationships of $0.06 \times T \leq h \leq 0.67 \times (2c)$ and $h/4 < w \leq (2c)/6$. When the height T is $0.06 \times T$ or more, the space is inhibited from being clogged by the formed thin film layer. When the height h and the width w of the space in the opening satisfy the relationships of $h \leq 0.67 \times (2c)$ and $h/4 < w \leq (2c)/6$, it is possible to make the incursion distance d of the thin film layer to the space smaller than the width w. According to this, the end of the thin film layer is effectively inhibited from going up onto the foot of the resist layer, and a portion such as an incursion portion 733 going up onto a foot 721 as illustrated in FIG. 14 is not formed. Therefore, a desired fine circuit pattern can be formed in high precision without causing film peeling. As to this reason, the present inventors presume that an incursion phenomenon has an influence thereon. This is specifically described with reference to FIG. 14 which is concerned with a conventional example.

FIG. 14(a) is a cross-sectional view of a product in which an opening in an inverse tapered shape is formed in a resist layer 72 on a substrate 71, and a thin film layer 73 (a thin film layer formed on the resist layer 72 is designated as a thin film layer 732, and a thin film layer formed on the substrate 71 is designated as a thin film layer 731) is formed on a top face thereof. Also, FIG. 14(b) is a cross-sectional view of a product in which, in FIG. 14(a), a protective layer 75 is further formed on a top face of the thin film layer 73, and the resist layer 72 is then peeled off.

In FIG. 14(a), the thin film layer 731 is formed on the substrate 71 in the opening in an inverse tapered shape formed in the resist layer 72. It is difficult to form the thin film layer 731 such that it does not come into contact with the resist layer 72. In general, as illustrated in FIG. 14(a), the thin film layer 731 is formed such that the end of the thin film layer 731 comes into contact with the resist layer 72 in the vicinity of a portion coming into contact with the substrate 71 in the resist layer 72, an end of which goes up onto the resist layer 72.

In this way, the phenomenon in which the both end portions of the thin film layer 731 are formed such that the thin film layer 731 is larger than a desired width is an incursion phenomenon. In the case where the thin film layer is formed by a vapor deposition method, especially a vapor deposition method using plasma, for example, an ion plating method, a sputtering method, etc., this incursion phenomenon is an inevitably occurring phenomenon. This is because a film-forming substance does not linearly fly from a target or the like toward the substrate or the like, and the scattered film-forming substance also flies from other directions toward the substrate with certain probability distribution.

A part (going-up portion) of the thin film layer 731 which is formed so as to go up onto the resist layer 72 in the vicinity of a portion where the substrate 71 and the resist layer 72 come into contact with each other as described above is hereinafter referred to as "incursion portion" (in FIG. 14(a), referred to as "incursion portion 733"). Further, a part of the resist layer 72 which is present interposed between the incursion portion 733 and the substrate 71 is referred to as "foot of the resist layer" (in FIG. 14(a), referred to as "foot 721 of the resist layer").

When the incursion portion 733 coming into contact with the resist layer 72 is formed by such an incursion phenomenon, the precision of the pattern comprising the thin film layer 731 is lowered. For example, as illustrated in FIG. 14(a), when the incursion portion 733 becomes in a state that it goes up onto the foot 721 of the resist layer, there may be the case where the foot 721 of the resist layer remains as in a portion 735 in FIG. 14(b) upon peeling off of the resist layer 72. Then, this could be a cause of fatal failures for an electronic circuit, such as, peeling off of the formed thin film layer 731 or contact failure, etc.

Further, for example, as illustrated in FIG. 14(b), in the case where another layer, for example, the protective layer 75 is formed on a top face of the thin film layer 731, the thin film layer 731 cannot be completely covered (a side face 734 of the incursion portion 733 is exposed without being covered as in a portion indicated by 736). Deterioration of the thin film layer 731 easily advances from this exposed portion. Then, an electronic circuit using such a pattern whose side face has been exposed as an electrode or the like easily causes disconnection.

On the other hand, in the manufacturing method of the invention, since a circuit pattern is formed by forming an opening having a cross-sectional shape as illustrated in FIG. 1, the incursion portion 733 as illustrated in FIG. 14 is not formed. According to this, the peeling off of the resist layer becomes easy, and a desired pattern can be formed in high precision. Also, in the end of the thin film layer (the thin film layer 31 in FIG. 1), remaining of the foot 721 of the resist layer or exposure of the side face 734 as illustrated in FIG. 14(*b*) is not caused. For that reason, an electronic circuit with high reliability can be manufactured.

When the pattern width of the thin film layer is too narrow, or the thickness of the thin film layer is too thin, if the thin film layer is used as an electrode, the resistance of the electrode becomes high. Further, when the pattern width is too wide, the number of electrodes which can be disposed in a certain width is limited. For that reason, especially in the case of using it as an electrode of PDP or the like, for the purposes of controlling the resistance of a pattern low and making it possible to realize high-definition display, it is preferable that the opening size 2*a* of the resist layer is from 20 to 200 μm, and the thickness T of the thin film layer is from 0.1 to 5 μm; and it is more preferable that 2*a* is from 25 to 150 μm, and the thickness T of the thin film layer is from 2 to 4 μm.

Furthermore, the thickness H of the resist layer is preferably from 2 to 40 μm, and more preferably from 10 to 30 μm. When the thickness H of the resist layer is less than 2 μm, there may be the case where it is relatively difficult to peel off the resist layer in the peeling-off step, whereby patterning becomes difficult. When it exceeds 40 μm, there is a concern that the incursion distance d becomes large, and the dimensional precision of the resist layer is lowered, whereby sufficient patterning precision is not obtained.

When the width w of the space is larger than (2*c*)/6, there is a concern that the resist layer which forms an eaves type droops, whereby the space is blocked. Also, when the width w of the space exceeds 20 μm, there is a concern that the opening-provided resist layer peels from the substrate before the peeling-off step. Therefore, it is preferable to regulate the width w of the space at not more than 20 μm.

In the manufacturing method of the invention, by further setting the height h at 0.1 μm and the width w at not more than 20 μm, when the thickness of the thin film layer is not more than 15 μm, it is possible to regulate the incursion distance d to not more than 2 μm. Such a circuit pattern can be preferably used as a front plate of PDP.

For example, in the case of setting the height H of the resist layer to 33 μm and the resist opening distance 2*a* to 25 μm, if the space height h is set to not more than 3 μm, and the width depth w of the space is set to more than 5 μm, it is possible to regulate the incursion distance d of the thin film layer to not more than 5 μm relative to the thickness T of the thin film layer of not more than 12 μm. Thus, the thin film layer does not go up onto the resist lower end, and therefore, such is preferable.

Also, when the thickness T of the thin film layer is set to not more than 8 μm, by setting the space height h to not more than 2 μm, it is possible to regulate the incursion distance d of the thin film layer to not more than 3 μm; and by setting the width depth w of the space to more than 3 μm, the thin film layer does not go up onto the resist lower end, and therefore, such is preferable.

Also, when the thickness T of the thin film layer is set to not more than 4 μm, by setting the space height h to not more than 1 μm, it is possible to regulate the incursion distance d of the thin film layer to not more than 1.5 μm; and by setting the width depth w of the space to more than 1.5 μm, the thin film layer does not go up onto the resist lower end, and therefore, such is preferable.

Also, when the thickness T of the thin film layer is set to not more than 2.8 μm, by setting the space height h to not more than 0.7 μm, it is possible to regulate the incursion distance d of the thin film layer to not more than 1.0 μm; and by setting the width depth w of the space to more than 1.0 μm, the thin film layer does not go up onto the resist lower end, and therefore, such is preferable.

Also, when the thickness T of the thin film layer is set to not more than 1.4 μm, by setting the space height h to not more than 0.4 μm, it is possible to regulate the incursion distance d of the thin film layer to not more than 0.5 μm; and by setting the width depth w of the space to more than 0.5 μm, the thin film layer does not go up onto the resist lower end, and therefore, such is preferable.

In the case of adopting the manufacturing method of the invention to the formation of an electrode for PDP, it is preferable to regulate the incursion distance d of the thin film layer into the space to not more than 1 μm. According to this, especially in the case of using it as an electrode for PDP, it becomes possible to adapt it with high-definition display.

Also, it is preferable that the opening of an eaves type further has a shape having an inverse tapered shape. The inverse tapered shape as referred to herein means a shape in which as illustrated in FIG. 1, a horizontal distance 2*b* between the respective boundaries of the resist end face 11 and the eaves bottom face 13 in two resist layers facing a single opening and an opening size 2*a* satisfy the relationship of 2*a*<2*b*. When the opening has such an inverse tapered shape, the incursion distance d becomes small. Thus, the incursion portion 733 as referred to in FIG. 14 is not formed, and therefore, such is preferable. Also, the attachment of the thin film layer to the resist end face 11 is inhibited, and the peeling off of the resist layer becomes easy. Therefore, such is preferable.

Next, in the opening forming step in the manufacturing method of the invention, the method of forming the foregoing opening in the resist layer is described.

In the opening forming step in the manufacturing method of the invention, after forming the resist layer on the substrate using a negative working resin by the foregoing method, an opening having the foregoing shape can be formed by carrying out exposure so as to satisfy the relationship of P<R<Q, wherein P, Q and R represent exposure amounts to an opening forming site, an opening non-forming site and a boundary site, serving as a boundary region of these sites, in the resist layer, respectively, thereby changing a degree of curing of the resist (namely, solubility in the developing solution) and adhesion between the resist layer and the substrate, site by site, followed by development.

Though the method of carrying out the exposure such that the exposure amounts P, Q and R to the opening forming site, the opening non-forming site and the boundary site as a boundary region of these satisfy the relationship of P<R<Q is not particularly limited, the formation can be preferably carried out by the following first to fourth exposure methods.

Figure 2:
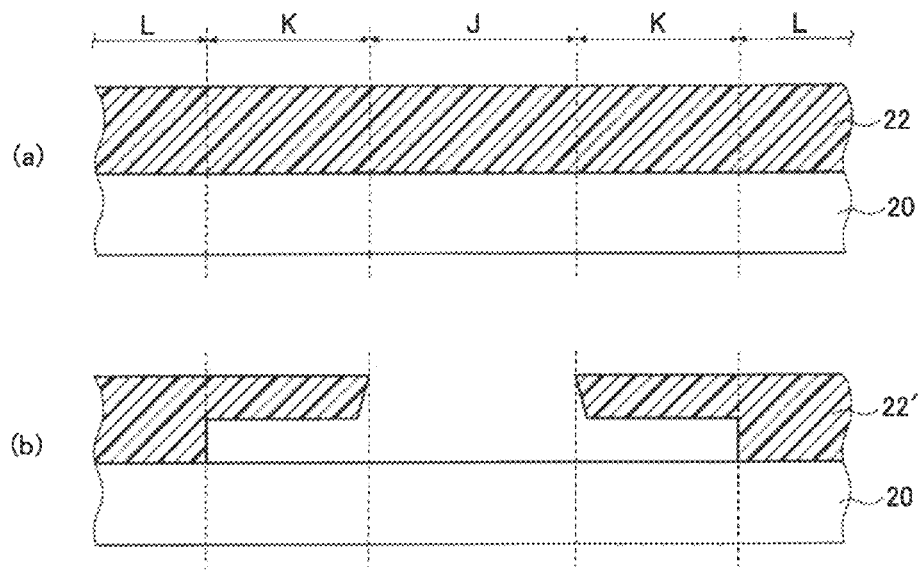
FIGS. 2(*a*) and 2(*b*) are each a diagrammatic cross-sectional view for explaining the resist opening forming step in the method for manufacturing a circuit pattern-provided substrate of the invention.
Figure 3:
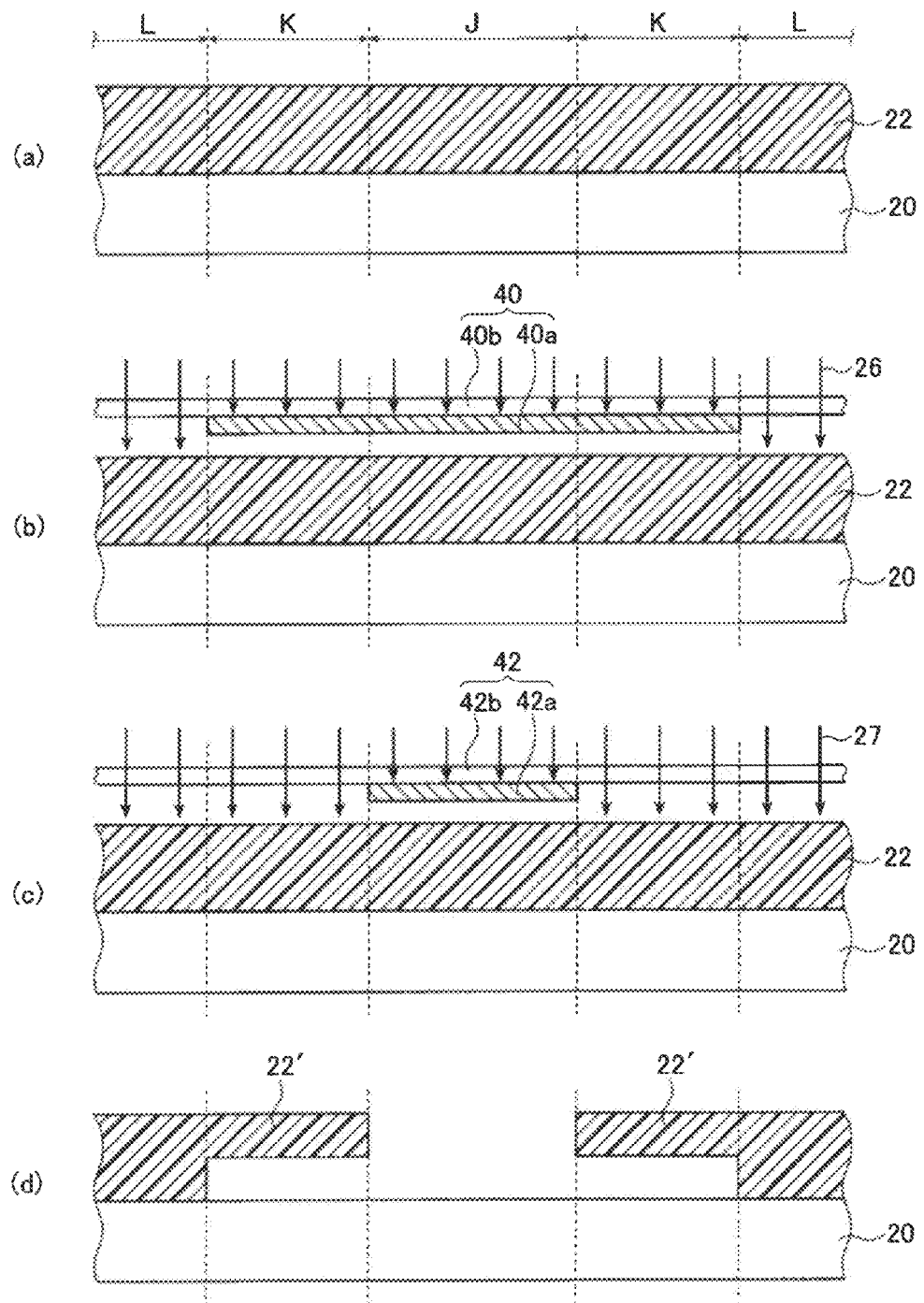
FIGS. 3(*a*) to 3(*d*) are each a diagrammatic cross-sectional view for explaining an opening forming method in the resist opening forming step of the method for manufacturing a circuit pattern-provided substrate of the invention.

First of all, the first exposure method is described with reference to FIGS. 2 and 3. FIG. 2(*a*) is a cross-sectional view of a state that a resist layer 22 is formed on a top face of a substrate 20; and FIG. 2(*b*) is a cross-sectional view of a state that the resist layer of FIG. 2(*a*) is exposed and developed to form an opening.

In the resist layer 22 as illustrated in FIG. 2(*a*), a region J which becomes an opening as illustrated in FIG. 2(*b*) is an opening forming site (referred to as "opening forming site J"). Similarly, a region K which becomes an eaves portion is a boundary site (referred to as "boundary site K"); and a region L which does not form an opening and which does not become an eaves portion is an opening non-forming site (referred to as "opening non-forming site L").

The opening having such a shape can be formed by changing the exposure amount to each of these sites and then carrying out exposure. Specifically, when the exposure amount to the opening forming site J is defined as P, the exposure amount to the boundary site K is defined as R, and the exposure amount to the opening non-forming site is defined as Q, the exposure is carried out such that the relationship of P<R<Q is satisfied.

Between the exposure amount of the resist layer and the thickness of the resist layer after the exposure, there is the relationship that when the exposure amount is increased, the thickness of the resist layer after the development increases, and when the exposure amount is a certain level or more, the thickness of the resist layer reaches a substantially constant value. In this specification, a minimum exposure amount at which the thickness of the resist layer after the development reaches a substantially constant value is defined as a saturated exposure amount. Though the saturated exposure amount varies with the material or thickness of the resist layer and the concentration or liquid temperature of the developing solution, it is approximately from 10 mJ/cm$^2$ to 500 mJ/cm$^2$.

In the manufacturing method of the invention, it is preferable that each of the exposures amounts P, Q and R falls within the following range relative to the saturated exposure amount. That is, the exposure amount P is preferably from 0% to 20%, and more preferably from 0% to 10% relative to the saturated exposure amount. The exposure amount R is preferably from 5% to 150%, and more preferably from 10% to 100% relative to the saturated exposure amount. The exposure amount Q is preferably from 25% to 500%, and more preferably from 50% to 200% relative to the saturated exposure amount.

Though the method of carrying out the exposure such that the exposure amounts P, Q and R satisfy the relationship of P<R<Q is not limited, it is preferable to carry out the exposure so as to satisfy the relationship of P<R<Q by using a mask which shields exposure light to the opening forming site J and the boundary site K and a mask which shields exposure light to the opening forming site J.

This is specifically described with reference to FIG. 3. FIG. 3(a) is a view illustrating a cross-sectional shape of the substrate 20 in which the resist layer 22 is formed on the substrate face, and similar to the foregoing FIG. 2(a), the opening forming site J, the boundary site K and the opening non-forming site L are present.

First of all, the exposure is carried out using a mask 40 provided with a complete light-shielding part 40a which shields transmission of exposure light 26 to the opening forming site J and the boundary site K and a complete transmission part 40b which transmits the exposure light 26 to the opening non-forming site L (FIG. 3(b)). In this case, in the resist layer 22, the opening non-forming site L is exposed, whereas the opening forming site J and the boundary site K are not exposed. Next, the exposure is carried out using a mask 42 provided with a complete light-shielding part 42a which shields transmission of exposure light 27 to the opening forming site J and a complete transmission part 42b which transmits the exposure light 27 to the opening non-forming site L and the boundary site K. In this case, in the resist layer 22, the opening non-forming site L and the boundary site K are exposed, whereas the opening forming site J is exposed.

By applying the exposure step, the opening non-forming site L is exposed twice, and the boundary site K is exposed once. In this way, it is possible to regulate the exposure amounts P, R and Q of the opening forming site J, the boundary site K and the opening non-forming site L at the desired exposure amounts such that the relationship of P<R<Q is satisfied. Then, by carrying out development and water washing, it is possible to provide the resist layer 22 with an opening having a cross-sectional shape of a desired eaves type as illustrated in FIG. 3(d).

By regulating the intensity or exposure time of the exposure lights 26 and 27, the exposure amount R to the boundary site K is regulated, thereby changing a degree of curing of the resist (solubility in the developing solution) and adhesion between the resist layer and the substrate depending upon the site. Thus, the width w and the height h of the space in the opening can be regulated. The order of the step as illustrated in FIG. 3(b) and the step as illustrated in FIG. 3(c) may be reversed.

Next, a second exposure method for forming the opening of an eaves type is specifically described with reference to FIG. 4. In the second exposure method, a mask which shields exposure light to the opening forming site J and which semi-transmits exposure light to the boundary site K is used. FIG. 4(a) is a view illustrating a cross-sectional shape of the substrate 20 in which the resist layer 22 is formed on the substrate face, and similar to the foregoing FIG. 2(a), the opening forming site J, the boundary site K and the opening non-forming site L are present. Then, FIG. 4(b) is a cross-sectional view illustrating a state that exposure with exposure light 28 is carried out using a mask 44 which shields transmission of the exposure light 28 to the opening forming site J and which semi-transmits the exposure light 28 to the boundary site K; and FIG. 4(c) is a cross-sectional view of an opening having a cross-sectional shape of an eaves type obtained by development after the exposure as illustrated in FIG. 4(b).

First of all, the resist layer 22 of FIG. 4(a) is exposed using the mask 44 provided with a complete light-shielding part 44a which shields transmission of the exposure light 28 to the opening forming site J, a semi-transmission part 44b which semi-transmits the exposure light 28 to the boundary site K and a complete transmission part 44c which transmits the exposure light 28 to the opening non-forming site L as illustrated in FIG. 4(b). By applying such an exposure step, it is possible to regulate the exposure amounts P, R and Q to the opening forming site J, the boundary site K and the opening non-forming site L such that the relationship of P<R<Q is satisfied. Then, by carrying out development and water washing, it is possible to provide an opening having a cross-sectional shape of a desired eaves type as illustrated in FIG. 4(c).

Here, the semi-transmission part 44b having a desired transmittance can be formed by, for example, forming a thin film made of a material capable of transmitting the exposure light 28 while absorbing a part thereof in a regulated thickness, or forming a light-shielding thin film having a minute pattern and having a regulated rate of opening. By using such a semi-transmitting mask, the exposure amount R in the boundary site K is regulated, thereby changing a degree of curing of the resist (solubility in the developing solution) and adhesion between the resist layer and the substrate depending upon the site. Thus, the width w and the height h of the space in the opening can be regulated.

Next, a third exposure method for forming the opening of an eaves type is described with reference to FIG. 5. In the third exposure method, a mask which shields exposure light to the opening forming site and the boundary site is used, and the exposure is carried out by changing a distance between this mask and the resist layer. FIG. 5(a) is a view illustrating a cross-sectional shape of the substrate 20 in which the resist layer 22 is formed on the substrate face, and similar to the foregoing FIG. 2(a), the opening forming site J, the boundary site K and the opening non-forming site L are present. A mask 46 which is used in this exposure method is provided with a complete light-shielding part 46a which shields transmission of exposure light 29 to the opening forming site J and the boundary site K and a complete transmission part 46b which transmits the exposure light 29 to the opening non-forming site L as illustrated in FIG. 5(b).

In this exposure method, first of all, the resist layer 22 of FIG. 5(a) is exposed in a state where the mask 46 is made close to the resist layer 22 (FIG. 5(b)). The "close state" as referred to herein means a state closer than a "distant state" as described below, and a distance between the resist layer 22 and the mask 46 is approximately from 0 to 200 μm. At that time, the opening non-forming site L in the resist layer 22 is exposed with the exposure light 29, whereas the opening forming site J and the boundary site K are not exposed.

Next, the resist layer 22 is again exposed in a state where the mask 46 (mask 46') is made distant from the resist layer 22 (FIG. 5(c)). The distant state of the mask 46 from the resist layer 22 as referred to herein means a state that the exposure light 29 is diffracted by an edge of the light-shielding part 46a to an extent that the opening of an eaves type in the invention can be formed. When the resist layer 22 is exposed in a distant state from the mask 46, as illustrated in FIG. 5(c), a part of the exposure light 29 is diffracted as in exposure light 29', and not only the opening non-forming site L but the boundary site K is exposed. A distance between the resist layer 22 and the mask 46' is approximately from 50 to 400 μm. The exposure may also be carried out while moving the mask 46.

According to such a method, by regulating the exposure amounts P, R and Q of the opening forming site J, the boundary site K and the opening non-forming site L so as to satisfy the relationship of P<R<Q, it is possible to change a degree of curing of the resist (solubility in the developing solution) and adhesion between the resist layer and the substrate depending upon the site. Then, by carrying out development and water washing, it is possible to provide the resist layer with an opening having a desired cross-sectional shape as illustrated in FIG. 5(d). The width w and the height h of the space in the opening can be regulated by regulating a distance of the mask 46 (mask 46') from the resist layer 22 to change the degree of exposure in the boundary site K.

Figure 5:
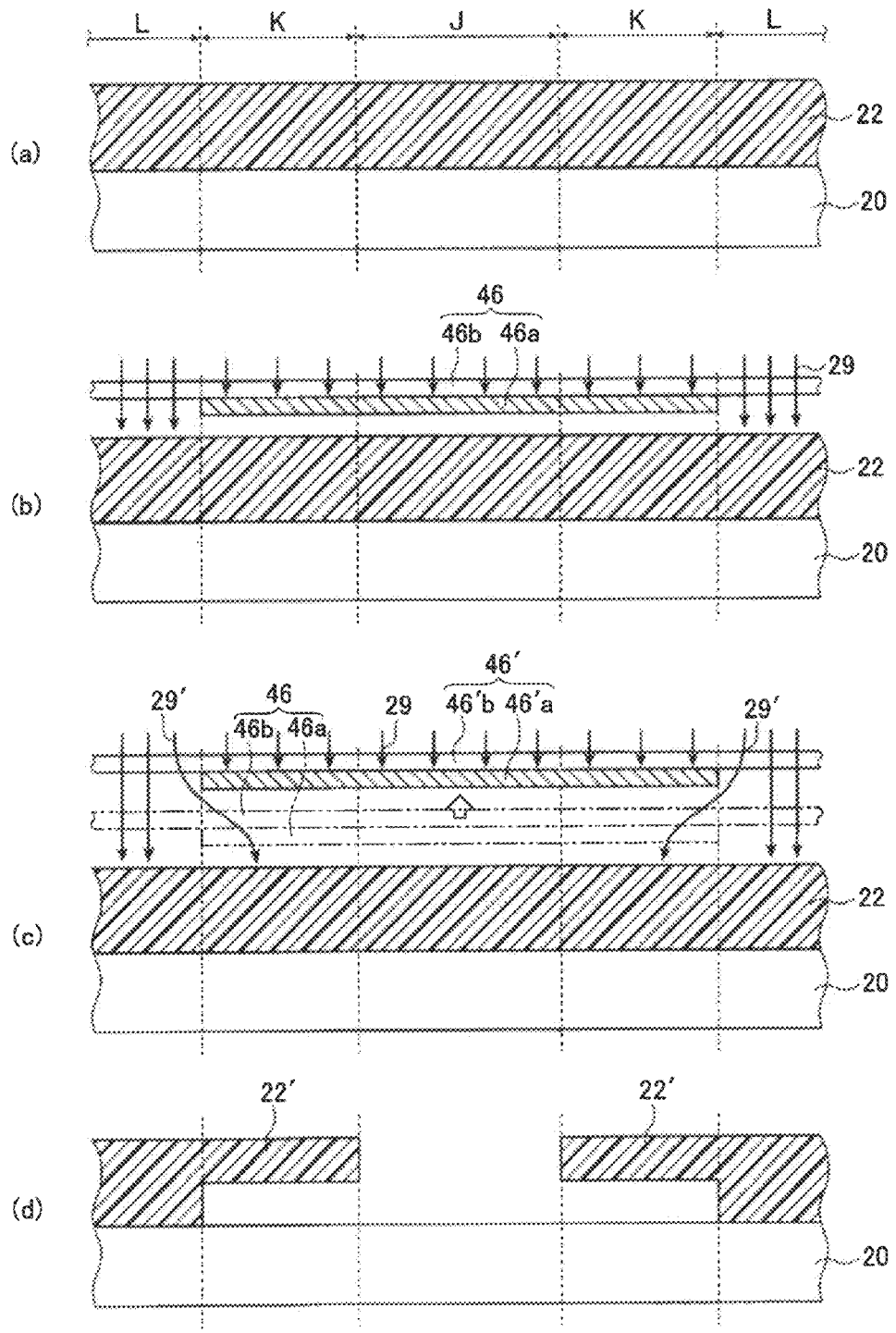
FIGS. 5(a) to 5(d) are each a diagrammatic cross-sectional view for explaining another opening forming method in the resist opening forming step of the method for manufacturing a circuit pattern-provided substrate of the invention.

In the foregoing explanation referring to FIG. 5, though a method in which the exposure is first carried out in a state that the mask 46 is made close to the resist 22, and thereafter, the exposure is carried out in a state that the mask 46 is made distant from the resist layer 22 has been shown, the order may be reversed. That is, when the explanation is made with reference to FIG. 5, the resist layer on the substrate as illustrated in FIG. 5(a) may be first exposed in a state that the mask 46 is made distant from the resist layer 22 as illustrated in FIG. 5(c), followed by exposure while making the mask 46 close to the resist layer 22 as illustrated in FIG. 5(b). In that case, an opening as illustrated in FIG. 5(d) can also be formed.

Next, a fourth exposure method for forming the opening of an eaves type is described. In the fourth exposure method, though the mask which shields exposure light to the opening forming site and the boundary site the same as in the third exposure method is used, the exposure is carried out while fixing the distance between the mask 46 and the resist layer 22 without being changed. After the exposure, by carrying out development and water washing, it is possible to provide the resist layer with an opening having a desired cross-sectional shape of an eaves type as illustrated in FIG. 5(d).

According to this exposure method, as illustrated in FIG. 5(c), the opening non-forming site L in the resist layer 22 is exposed with the exposure light 29 which has been transmitted by the complete transmission part 46b of the mask 46; in the opening forming site J in the resist layer 22, transmission of the exposure light is shaded by the complete light-shielding part 46a of the mask 46, and the exposure is inhibited; and the boundary site K in the resist layer 22 is exposed with diffracted light 29' emitted in the periphery of the complete light-shielding part 46a of the mask 46.

The exposure amount R to the boundary site K can be regulated by, for example, changing the distance between the mask 46 and the resist layer 22 at the time of exposure depending upon the exposure amount Q to the opening non-forming site L. It is preferable that the distance between the mask 46 and the resist layer 22 at the time of exposure is properly chosen within the range of from, as a lower limit, substantially zero when the mask 46 is brought into intimate contact with the resist layer and exposed to achieve contact exposure to 500 μm depending upon a condition of the exposure optical system to be used. Furthermore, the exposure amount R to the boundary site K in the resist layer 22 can be further regulated utilizing roundabout light or multiple-reflection light by making the exposure light incident to the mask 46 and the resist layer while inclining an incident angle, or adjusting the distance between the mask 46 and the resist layer 22. The inclination of the incident angle is preferably chosen within the range of from 1 to 5°. In this way, the exposure can be carried out such that the exposure amounts P, R and Q of the opening forming site J, the boundary site K and the opening non-forming site L satisfy the relationship of P<R<Q.

In the case of employing this exposure method, it is more preferable to regulate the exposure amount Q in the opening non-forming site L to from 25 to 100% of the saturated exposure amount, the exposure amount R in the boundary site K to from 10 to 80% of the saturated exposure amount and the exposure amount P in the opening forming site J to from 0 to 20% of the saturated exposure amount, respectively.

By carrying out the exposure under the foregoing conditions, the resist layer in the opening forming site L is thoroughly cured in the majority of the surface and the inside of the layer, whereas the resist layer in the boundary site K can be made in a semi-cured state in which the exposure amount is especially low in the vicinity of the substrate interface. For that reason, when development is carried out subsequent to the exposure, the resist layer in an exposed area is not substantially eluted, whereas, in the resist layer in the boundary site between an exposure site and a non-exposure site, a portion in the vicinity of the substrate interface where the exposure amount is especially low is eluted, whereby an opening having a desired cross-sectional shape can be formed in the resist layer.

When the exposure amount P to the opening non-forming site L is less than 25% of the saturated exposure amount, the adhesion between the resist layer and the substrate is insufficient so that there is a concern that the resist layer peels in a post-step such as the development step or the thin film layer forming step, etc.; and when it exceeds 100% of the saturated exposure amount, the appropriate exposure amount R to the boundary site K is not obtained so that there is a concern that the space having appropriate height h and width W cannot be formed. That is, there is a concern that the end of the thin film layer formed in the thin film layer forming step described below goes up onto the foot of the resist layer, whereby the resist layer cannot be peeled off from the substrate in the peeling-off step described below, or the reliability of an electronic circuit device using the resulting circuit pattern-provided substrate becomes insufficient.

In the opening forming step in the manufacturing method of the invention, the development which is carried out after the exposure by any of the first to fourth exposure methods can be carried out by a usual method. That is, the treatment is carried out by means of immersion or spraying or the like by using an aqueous solution of an inorganic alkali such as sodium hydroxide or potassium hydroxide, a sodium carbonate aqueous solution or an aqueous solution of an organic base such as quaternary ammonium salts represented by tetramethylammonium hydroxide or choline as a developing solution. It is preferable to appropriately regulate or choose the temperature of the developing solution, additives, the time for carrying out the development treatment and the like so as to obtain a desired cross-sectional shape of the opening.

In particular, in the case of employing the fourth exposure method, it is preferable that the time for carrying out the development treatment is chosen within the range of from 2 times to 10 times the break point which is the time starting from the initiation of development until the resist layer in a non-exposed area elutes to expose the substrate surface.

The water washing to be carried out after the development is carried out using pure water or ion exchanged water and may be carried out so as to remove the resist material in an uncured state. It is preferable that the water washing is carried out for a time ranging from 0.05 to 3 times the development time. Incorporation of a monovalent to trivalent metal ion into water to be used for the water washing is preferable, because swelling of the end of the resist can be inhibited. The content of the monovalent to trivalent metal ion is preferably from 0.0005 to 5% by mass relative to water. When the content of the monovalent to trivalent metal ion is less than 0.0005% by mass, there is a concern that an effect for inhibiting swelling of the resist is not obtained; and when it exceeds 5% by mass, there is a concern that the eluted resist is coagulated to form a deformed substance, leading to a defect. As the metal ion to be contained in water which is used for the water washing, a divalent metal ion, for example, a $Ca^{2+}$ ion, an $Mg^{2+}$ ion, a $Ba^{2+}$ ion, etc. is preferable, with a $Ca^{2+}$ ion or an $Mg^{2+}$ ion being more preferable. The content of the divalent metal ion is preferably from 0.005 to 0.5% by mass relative to water. When the content of the divalent ion is less than 0.005% by mass, there is a concern that an effect for inhibiting swelling of the resist is not obtained; and when it exceeds 0.5% by mass, there is a concern that a defect due to coagulation of the eluted resist is caused.

It is preferable to carry out heat treatment of the resist layer either before or after or both before and after the exposure treatment, because this stabilizes the adhesion to the substrate. It is preferable that the heat treatment before this exposure is usually carried out at a temperature in the range of from 80 to 150° C. for from 0.5 to 3 minutes and that the heat treatment after the exposure is usually carried out at a temperature in the range of from 80 to 200° C. for from 1 to 10 minutes.

The resist layer may be a resist layer composed of two or more layers as described above. In that case, it is preferable that a resist layer coming into contact with the surface of the substrate (this being referred to as "resist layer F") is constituted of a material having a faster dissolution rate in the developing solution at the time of development than that of the other part of the resist layer (this being referred to as "resist layer G"). It is preferable that the resist layer F coming into contact with the surface of the substrate is one having usual photosensitivity, or one having low sensitivity as compared with a layer as described below; and that the other resist layer G is one containing carbon black fine particles and the like and having appropriate light-shielding properties, or one having high sensitivity as compared with the resist layer F. It is preferable that the resist layer F and the resist layer G have a thickness of from 0.1 to 5 μm and from 2 to 40 μm, respectively.

The resist layer F may be composed of plural layers. Namely, in the resist layer composed of two or more layers, plural layers composed of one resist layer which comes into contact with the substrate among these layers and one or more resist layers coming into contact with this layer, and made of a material having a relatively faster dissolution rate in the developing solution than the resist layer G to be further laminated thereon can be regarded as the resist layer F.

Then, after forming and exposing each of the resist layers of the resist layer F and the resist layer G in the method as described above in the resist layer forming step, an opening is formed using a developing solution. More specifically, the treatment for development can be carried out by means of immersion or spraying or the like by using, for example, an aqueous solution of an inorganic alkali such as sodium hydroxide or potassium hydroxide or an aqueous solution of an organic base such as quaternary ammonium salts represented by tetramethylammonium hydroxide or choline as the developing solution.

If desired, the photoresist layer can be heat treated either before or after or both before and after the exposure treatment. It is preferable that the heat treatment before the exposure is carried out at a temperature in the range of from 80 to 150° C. for from 30 seconds to 3 minutes and that the heat treatment after the exposure is usually carried out at a temperature of from 80 to 200° C. for from 1 to 10 minutes. In such case, since the dissolution rate of the resist layer F in the developing solution is fast as compared with that of the resist layer G, an opening having the foregoing cross-sectional shape of an eaves type can be formed. By changing the kind of a material to be used in each of the resist layers, it is possible to control the width w and the height h of the space of the eaves type in the cross-sectional shape of the opening.

Figure 15:
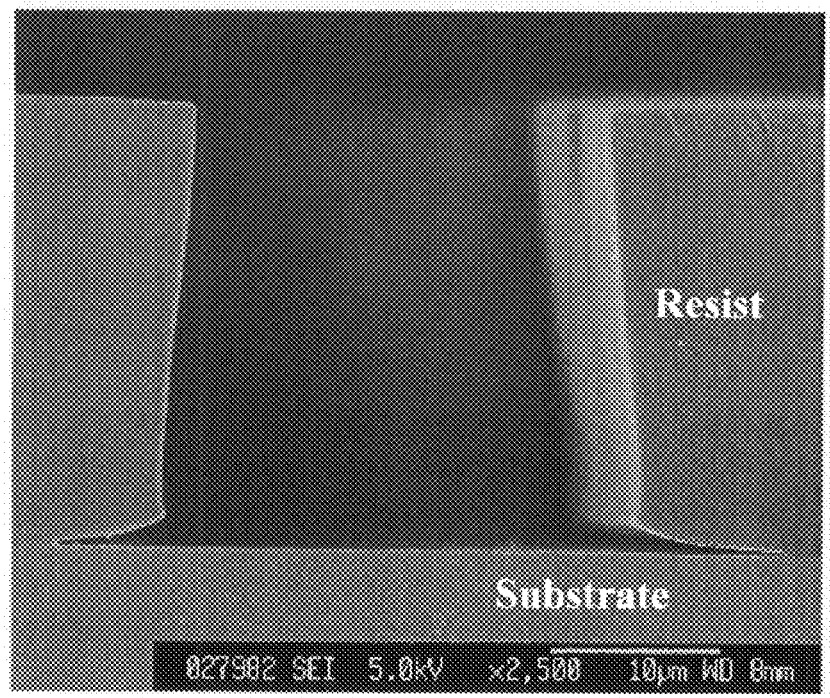
FIG. 15 is an SEM photograph of a cross section of the periphery of an opening of a resist layer in which an opening is formed by the method for manufacturing a circuit pattern-provided substrate of the invention.
Figure 16:
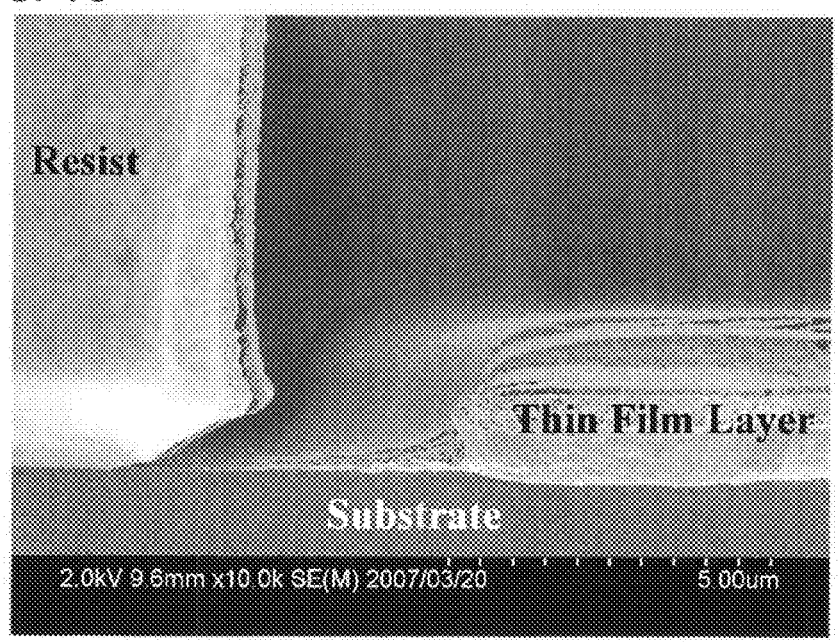
FIG. 16 is an SEM photograph of a cross section of the periphery of an opening of a resist layer in which an opening is formed, and a thin film layer is subsequently formed on the opening and on the resist layer by the method for manufacturing a circuit pattern-provided substrate of the invention.

FIG. 15 is an SEM photograph of a cross section in the periphery of an opening of a resist layer in which the opening is formed by the manufacturing method of a circuit pattern-provided substrate of the invention, and it can be seen that a space having a height h of 2.0 μm and a width w of 4.0 μm is formed in an opening having 2a of 27.0 μm and 2b of 30.0 μm. FIG. 16 is an SEM photograph of a cross section in the periphery of an opening of a resist layer in which a thin film layer having a film thickness T of 3.0 μm, in which a Cr layer having a film thickness of 100 nm, a Cu layer having a film thickness of 2,800 nm and a Cr layer having a film thickness of 100 nm are laminated in this order on the opening and on the resist layer of FIG. 15. It can be seen that though an end of the thin film layer intrudes into the space, it does not go up onto the foot of the resist layer because it has a space of the foregoing size.

<Thin Film Layer Forming Step>

Next, the thin film layer forming step in the manufacturing method of the invention is described. The thin film layer forming step is a step of forming a thin film layer on the substrate and on the resist layer.

A material of the thin film layer to be formed in the thin film layer forming step is not particularly limited. Any material is useful so far as it is able to form a thin film layer on the substrate and on the resist layer by a method as described below. Also, this thin film layer may be composed of a single layer or plural layers. Further, its thickness is not particularly limited and may be, for example, from about 0.1 to 10 μm. From the viewpoints of securing a favorable adhesion to the substrate and securing favorable conductivity, the thickness of the thin film layer of the circuit pattern is preferably from 0.1 to 5 μm.

The thin film layer is composed of a single layer or two or more layers; and it is preferable that one or more layers thereof are a layer containing at least one member selected from the group consisting of Cu, Al, Ag, Ni, $SnO_2$, ITO and ZnO as a major component. This layer easily conducts electricity, and therefore, it can be preferably used as an electrode layer (hereinafter also simply referred to as "electrode layer"). The term "major component" as referred to herein means that such a component is contained in an amount of 50% by mass or more. This content is preferably 80% by mass or more, more preferably 90% by mass or more, and further preferably 99% by mass or more. The term "major component" is hereinafter used so as to have the same meaning.

In the material for forming the electrode layer, when Cu is a major component, it is preferable to use Cr, Ti or Mn as other component to be contained; and when Ag is a major component, it is preferable to use other component such as Pd or Au. Also, for the purpose of enhancing the conductivity, when $SnO_2$ is a major component, it is preferable to use Ta, Nb or Sb as other component to be contained; and when ZnO is a major component, it is preferable to use Al, Ga or In as other component to be contained.

In the case where the electrode layer is made of a layer containing at least one member selected from the group consisting of Cu, Al, Ag and Ni as a major component, it is preferable that the thin film layer further includes a layer containing at least one member selected from the group consisting of Cr, Ti, Mo and W as a major component. This layer has high adhesion to the electrode layer, the protective layer as described below, the substrate or the like, and can be preferably used as an adhesive layer (this layer will also be hereinafter referred to as "adhesive layer"). Also, it is preferable that the thin film layer has three layers and is of a structure in which one layer thereof is the electrode layer, and two layers serving as the adhesive layer are present so as to interpose the subject electrode layer therebetween. Namely, it is preferable that the thin film layer has a structure in which the adhesive layer is present on each of one main plane and the other main plane of the electrode layer (adhesive layer/electrode layer/adhesive layer). Also, from the standpoint of enhancing durability, it is especially preferable that the adhesive layers simultaneously cover a side face of the electrode layer. Such a three-layer structure is also hereinafter referred to as a laminated electrode layer.

As the thin film layer, a laminated electrode layer in which an adhesive layer containing Cr as a major component and an electrode layer containing Cu as a major component are laminated; and a laminated electrode layer in which an adhesive layer containing Ti as a major component and an electrode layer containing Cu as a major component are laminated are especially preferable. Also, as such a thin film layer, those having a structure of further including other layer such as a low-reflection layer or another adhesive layer, etc. are similarly preferable. Such a laminated electrode layer-containing thin film layer can be preferably used as a bus electrode in a PDP front substrate.

Also, the electrode layer may be a layer composed of a conductive transparent conductive material containing at least one member selected from the group consisting of $SnO_2$, ITO and ZnO as a major component (this layer will be hereinafter referred to as "transparent electrode layer"). Such a transparent electrode layer-containing thin film layer can be preferably used as a discharge maintaining electrode in a PDP front substrate.

In the thin film layer forming step in the manufacturing method of the invention, as a method of forming a thin film layer on the substrate and the resist layer, a usual vapor deposition method, for example, a physical vapor deposition method (a vacuum vapor deposition method by electron beams, ohmic-resistance heating, etc., an ion plating method, a sputtering method or an ion beam sputtering method), a chemical vapor deposition method (a thermal CVD method, a plasma CVD method or a photo CVD method), etc. can be applied.

For example, a layer containing Cu as a major component by means of sputtering can be formed by sputtering using a Cu target under an inert atmosphere of argon, etc. A layer containing Cr or Ti, etc. as a major component can be similarly formed. Here, the sputtering may be carried out while mixing $N_2$ or $CH_4$, etc. in argon or the like. Also, in the case of forming a layer of an oxide as the thin film layer, the sputtering may be carried out under an oxygen-containing atmosphere.

In order to make the thin film layer have a desired thickness, for example, the foregoing preferred thickness, adjustment can be made by controlling a film-forming time, etc. in a conventionally publicly known method, for example, a vapor deposition method such as sputtering, a vapor deposition method, etc. Further, a protective layer as described below may be subsequently formed on this thin film layer.

<Peeling-Off Step>

Next, the peeling-off step in the manufacturing method of the invention is described. In the manufacturing method of the invention, the peeling-off step is a step of peeling off the resist layer and the thin film layer formed on the resist layer from the substrate. Here, the method of peeling off the resist layer from the substrate is not particularly limited. For example, a wet peeling method or a mechanical peeling method, each of which is a conventionally publicly known method, can be applied.

The wet peeling method includes a conventionally publicly known method of immersing in a solvent for peeling. This solvent includes a water-soluble peeling solution of, for example, sodium hydroxide, potassium hydroxide, periodic acid, sodium periodate, etc. The resist layer and the substrate can be favorably peeled off from each other by heating and controlling such a water-soluble peeling solution having a concentration of several mass percent at from 30 to 80° C., and immersing in a vat-shaped container or the like while oscillating or by spray treating while controlling a spray pressure at from 0.1 to 0.5 MPa using a full-cone nozzle or the like.

Further, the mechanical peeling method includes, for example, a method of ripping off from an end of the resist layer; a method of achieving peeling using a member capable of bonding to the thin film layer formed on the resist layer; a method of achieving peeling by suction in a reduced pressure state; a method of achieving peeling by spraying a high-pressure gas or liquid to blow away the resist layer; a method of achieving peeling by rubbing with a brush, etc.; and the like.

The method of ripping off from an end of the resist layer includes, specifically, a method in which an end of the resist layer is grasped, and the resist layer is ripped off from the end step by step; and a method in which the thin film layer formed on the resist layer is adsorbed on a roller, and the roller is then rotated to peel off the resist layer together with the thin film layer. Further, the method of achieving peeling using a member capable of bonding to the thin film layer formed on the resist layer includes, specifically, a method in which using an adhesive member such as an adhesive tape, etc., the thin film layer is bonded to the adhesive tape and peeled off; and a method in which an adhesive tape is installed on a roller, and the roller is rotated while bonding the thin film layer to the adhesive tape to peel off.

Further, the method of achieving peeling by suction in a reduced pressure state includes a method in which after forming the thin film layer on the resist layer, the pressure is evacuated, thereby peeling off the resist layer together with the thin film layer. In that case, it is sufficient to carry out evacuation to such an extent that the resist layer and the thin film layer can be peeled off. Also, the method of achieving peeling by spraying a high-pressure gas or liquid to blow away the resist layer as referred to herein is a method in which after forming the thin film layer on the resist layer, a gas or a liquid is sprayed, thereby peeling off the resist layer together with the thin film layer. In that case, it is sufficient to spray a gas or a liquid under a pressure to such an extent that the resist layer and the thin film layer can be peeled off.

The manufacturing method of the invention is a method for manufacturing a circuit pattern-provided substrate including the above-described resist layer forming step, opening forming step, thin film layer forming step and peeling-off step.

The manufacturing method of the invention may include a plural number of each of the resist layer forming step, the opening forming step, the thin film layer forming step and the peeling-off step. For example, the circuit pattern may be formed by subjecting the substrate to the resist layer forming step, the opening forming step, the thin film layer forming step and the peeling-off step to form a circuit pattern comprising a thin film layer on the substrate; further carrying out the resist layer forming step and the opening forming step; then forming a protective layer as described below or a thin film layer with a different pattern from that in the forgoing thin film layer forming step; and thereafter, carrying out the peeling-off step.

<Protective Layer Forming Step>

In such a manufacturing method of the invention, it is preferable that a protective layer forming step of forming a protective layer for covering the surface and side face of the thin film layer is further included. The protective layer forming step is included after the thin film layer forming step. The protective layer forming step may be included either after or before the peeling-off step. For example, the substrate may be subjected to the resist layer forming step, the opening forming step and the thin film layer forming step and subsequently subjected to the protective layer forming step, and thereafter, the resist layer and the thin film layer and the protective layer formed thereon can be peeled off from each other.

When the manufacturing method of the invention includes the protective layer forming step, a protective layer capable of protecting a circuit pattern of the circuit pattern-provided substrate manufactured by the manufacturing method of the invention can be formed, and deterioration of characteristics in a post-step is suppressed, or a circuit pattern-provided substrate with excellent reliability is obtained. Hence, this is preferable.

In the case where a pattern of the protective layer is different from that of the thin film layer, the formation can be carried out in such a manner that subsequent to the resist layer forming step, the opening forming step and the thin film layer forming step, the peeling-off step is carried out to form a circuit pattern comprising a thin film layer; thereafter, the resist layer forming step and the opening forming step are again carried out, and the protective layer forming step is subsequently carried out to form a protective layer; and the peeling-off step is carried out to peel off the resist layer and the protective layer formed thereon, thereby forming a lamination of a thin film layer with a desired pattern and a protective layer with a desired pattern.

Though a material of this protective layer is not particularly limited, it is preferable that the material contains at least one member selected from the group consisting of $SiO_2$, $TiO_2$, $ZrO_2$, $Ta_2O_5$, $Cr_2O_3$ and $SnO_2$ as a major component. When the protective layer is made of such a material, in the case where the circuit pattern-provided substrate manufactured by the manufacturing method of the invention is used as, for example, a PDP front substrate upon further formation of a dielectric layer or the like on the surface thereof, the thin film layer can be protected by the protective layer from oxidation in a high-temperature process for forming the dielectric layer or the like or corrosion from the dielectric layer itself. Hence, this is preferable. Above all, $SnO_2$ is preferable because its protection performance is more excellent.

Furthermore, it is preferable that the protective layer is composed of two or more layers, in which at least two layers thereof include a layer containing $SnO_2$ as a major component and a layer formed thereon and containing $SiO_2$ as a major component. This is because the protection performance is more excellent. It is more preferable that the protective layer is made of $SnO_2$ containing at least one member selected from the group consisting of Ta, Nb and Sb. Though the content of Ta, Nb and Sb in the $SnO_2$ protective layer is not particularly limited, it is preferably from 0.5 to 15% by mass, and more preferably from 3 to 10% by mass. This is because such a content can impart an electrically conductive characteristic also to the protective layer.

Though the thickness of the protective layer is not particularly limited and may be set to a desired thickness, it is preferably from 0.05 to 1 μm, and more preferably 0.1 to 0.5 μm. The definition, measurement method and control method of the thickness of the protective layer are the same as in the case of the thin film layer. Also, as to the formation method of the protective layer, a vapor deposition method can be employed similarly to the formation method of the thin film layer.

In the manufacturing method of the invention, it is preferable that the thin film layer forming step is a step in which an adhesive layer containing Cr and/or Ti as a major component is formed on the substrate and the resist layer, an electrode layer containing Cu as a major component is formed on a top face of the adhesive layer, and an adhesive layer containing Cr and/or Ti as a major component is further formed on a top face of the electrode layer, and that the protective layer forming step is a step of forming a protective layer containing $SnO_2$ as a major component on the surface of the thin film layer.

Such a circuit pattern-provided substrate manufactured by the manufacturing method of the invention can be favorably used as a PDP front substrate.

<Low-Reflection Layer Forming Step>

Also, in the manufacturing method of the invention, it is preferable that a low-reflection layer forming step of forming a low-reflection layer between the thin film layer with the foregoing circuit pattern and the substrate is further included. It is preferable that this low-reflection layer forming step is provided after the opening forming step and before the thin film layer forming step. For example, a preferred circuit pattern-provided substrate of the invention as described below can be manufactured by, after the resist layer forming step and the opening forming step, forming this low-reflection layer and, after the thin film layer formation, further carrying out the peeling-off step.

It is preferable that the low-reflection layer made of such a material is formed on the substrate, because in the case of forming a circuit pattern-provided substrate manufactured by the manufacturing method of the invention and using it as, for example, a PDP front substrate, the low-reflection layer functions as an antireflection layer when the thin film layer is observed from the substrate side, thereby enhancing the contrast.

Also, it is preferable that the low-reflection layer contains chromium oxide and/or titanium oxide as a major component. The term "major component" as referred to herein means that the content in the low-reflection layer is 50% by mass or more. This content is preferably from 70 to 100% by mass, more preferably from 80 to 100% by mass, and further preferably from 90 to 100% by mass or more. As a material other than this major component for forming the low-reflection layer, for example, nitrogen or carbon is preferably incorporated. This is because the antireflection performance can be enhanced.

The thickness of the low-reflection layer is not particularly limited. Though it can be set to a desired thickness, it is preferably from 0.03 to 0.1 µm, and more preferably from 0.04 to 0.07 µm. The definition, measurement method and control method of the thickness of the low-reflection layer are the same as in the case of the thin film layer. Also, as to the formation method of the low-reflection layer, a vapor deposition method can be employed similarly to the formation method of the thin film layer.

In the manufacturing method of the invention, it is preferable that the thin film layer forming step is a step in which an adhesive layer containing Cr and/or Ti as a major component is formed on the substrate and the resist layer, an electrode layer containing Cu as a major component is formed on a top face of the adhesive layer, and an adhesive layer containing Cr and/or Ti as a major component is further formed on a top face of the electrode layer, and that the protective layer forming step is a step of forming a protective layer containing $SnO_2$ as a major component on the surface of the thin film layer, and that the low-reflection layer forming step is a step of forming a low-reflection layer containing chromium oxide and/or titanium oxide as a major component.

Such a circuit pattern-provided substrate manufactured by the manufacturing method of the invention can be favorably used as a PDP front substrate.

<Second Thin Film Layer Forming Step>

The manufacturing method of the invention can include a second thin film layer forming step of forming a second thin film layer between the thin film layer and the substrate. This second thin film layer forming step is included before the foregoing thin film layer forming step. The second thin film layer forming step may be provided before the resist layer forming step or may be provided after the opening forming step and before the foregoing thin film layer step.

For example, the circuit pattern-provided substrate of the invention according to a preferred embodiment as described below can be manufactured by, after the resist layer forming step and the opening forming step, carrying out this second thin film layer forming step to form a circuit pattern comprising a second thin film layer on the substrate; further carrying out a resist forming step to form a resist layer on a top face of the circuit pattern comprising the second thin film layer; after carrying out an opening forming step, further carrying out the foregoing thin film layer forming step; and thereafter, carrying out the peeling-off step.

Though a material of this second thin film layer is not particularly limited, it is preferable that it contains at least one member selected from the group consisting of Cu, Al, Ag, Ni, $SnO_2$, ITO and ZnO as a major component. This is because in the case where the circuit pattern-provided substrate manufactured by the manufacturing method of the invention is formed and used as, for example, a PDP front substrate, the second thin film layer can be used as a different electrode from the foregoing thin film layer. In particular, in a PDP application, it is preferable to use a transparent conductive material containing at least one member selected from the group consisting of $SnO_2$, ITO and ZnO as a major component as the second thin film layer, because it can be used as a transparent sustain electrode. In that case, it is more preferable that the protective layer further contains $SiO_2$ as a major component. The definition, measurement method and control method of the thickness of the second thin film layer are the same as in the case of the foregoing thin film layer. Also, as to the formation method of the second thin film layer, a vapor deposition method can be employed similarly to the formation method of the foregoing thin film layer.

Figure 6:
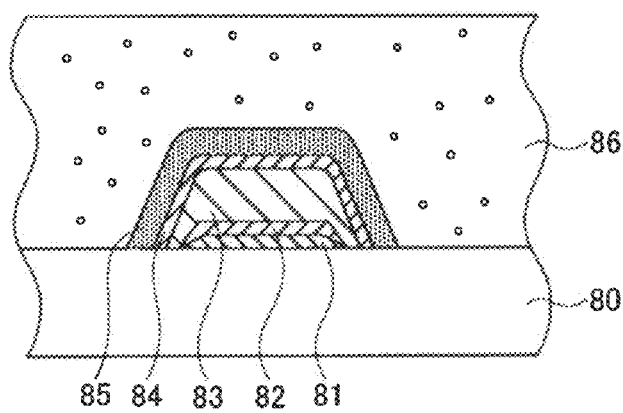
FIG. 6 is a diagrammatic cross-sectional view illustrating a preferred embodiment of the circuit pattern-provided substrate of the invention.
Figure 7:
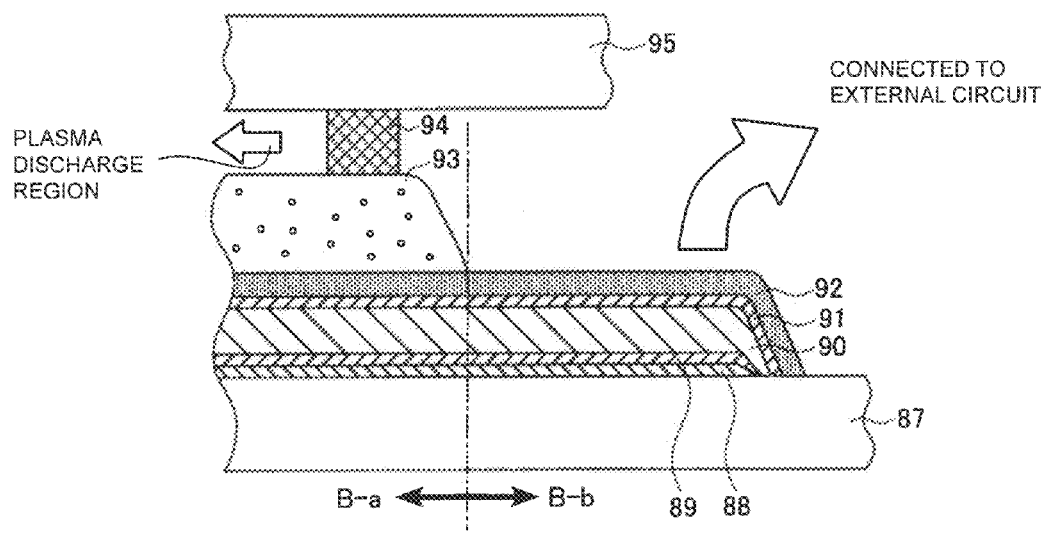
FIG. 7 is a diagrammatic cross-sectional view illustrating a preferred embodiment of the PDP of the invention.

As illustrated in FIGS. 6 and 7, it is preferable that an opposite face to the face coming into contact with the substrate and a side face of the thin film layer are covered by the adhesive layer and/or the protective layer.

FIG. 6 is a diagrammatic cross-sectional view in which a dielectric layer is further formed on a circuit pattern-provided substrate obtained by the manufacturing method of the invention. The circuit pattern-provided substrate as illustrated in FIG. 6 has a pattern comprising a thin film layer in which a $Cr_2O_3$ layer 81, a Cr layer 82, a Cu layer 83, a Cr layer 84 and an $SnO_2$ layer 85 are laminated on a top face of a glass substrate 80 and further has a dielectric layer 86 on a top face thereof. Here, the $Cr_2O_3$ layer as referred to herein means a layer containing $Cr_2O_3$ as a major component. The Cr layer, the Cu layer, the Cr layer and the $SnO_2$ layer also have a similar meaning.

FIG. 7 is a diagrammatic cross-sectional view of a plasma display panel (PDP) manufactured using the circuit pattern-provided substrate having a dielectric layer formed thereon as illustrated in FIG. 6. Similar to FIG. 6, PDP as illustrated in FIG. 7 has a pattern comprising a thin film layer in which a $Cr_2O_3$ layer 88, a Cr layer 89, a Cu layer 90, a Cr layer 91 and an $SnO_2$ layer 92 are laminated on a top face of a glass substrate 87 and further has a dielectric layer 93 on a top face thereof, which faces a glass opposing substrate 95 via a contact seal material 94.

Figure 10:
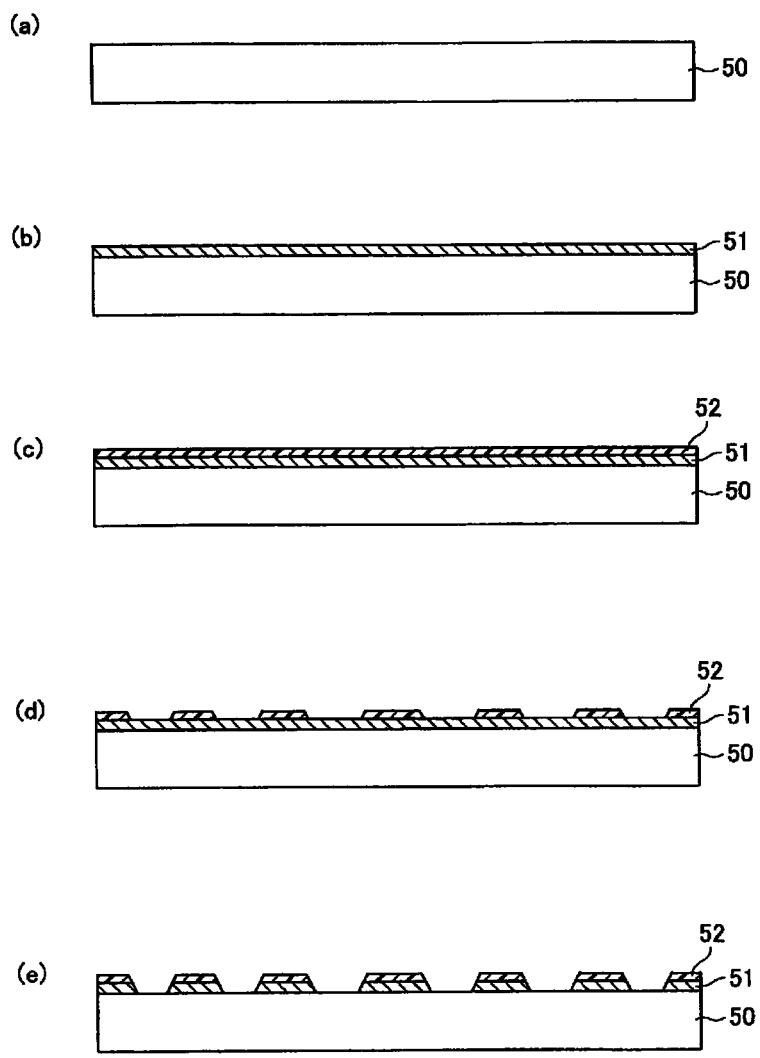
FIGS. 10(a) to 10(e) are each a cross-sectional view illustrating a part of conventional steps of forming a thin film circuit pattern and illustrating a diagrammatic configuration of an electronic circuit.
Figure 11:
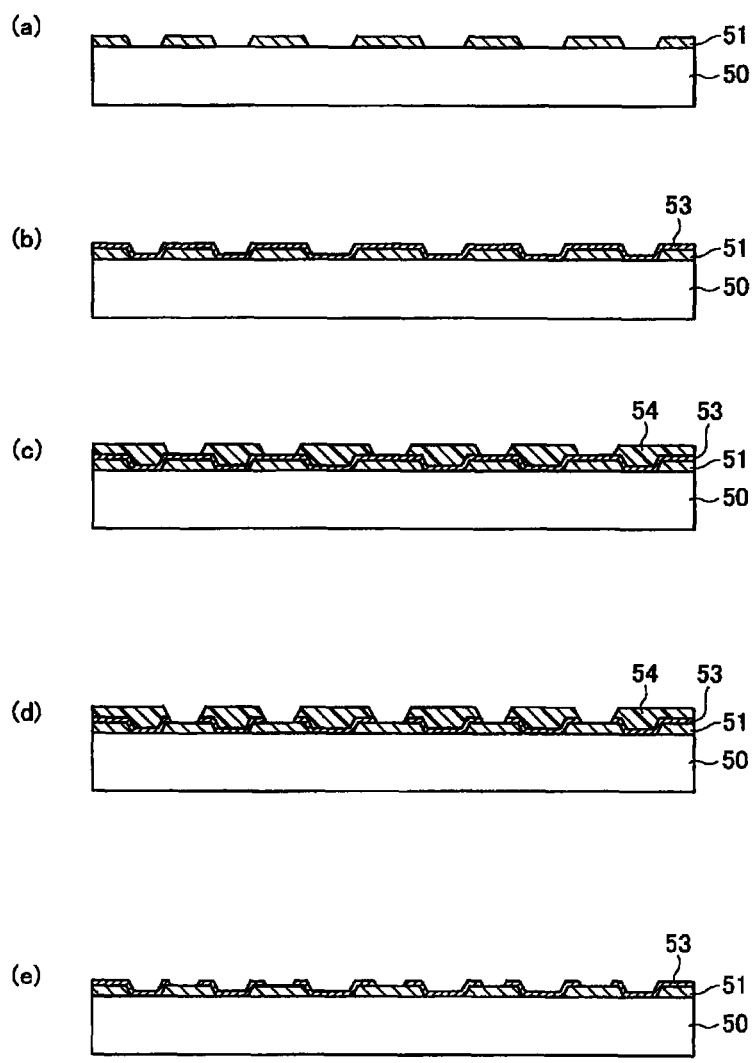
FIGS. 11(a) to 11(e) are each a cross-sectional view illustrating steps subsequent to the steps of FIG. 10 and illustrating a diagrammatic configuration of an electronic circuit.
Figure 12:
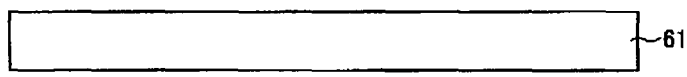
FIGS. 12(a) to 12(e) are each a cross-sectional view illustrating a part of conventional steps of forming a thin film circuit pattern and illustrating a diagrammatic configuration of an electronic circuit.
Figure 12:
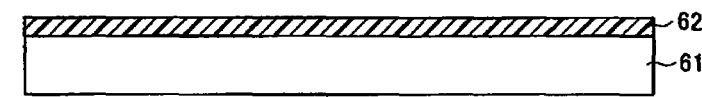
Figure 12:
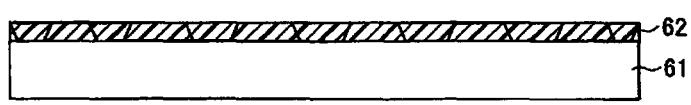
Figure 12:
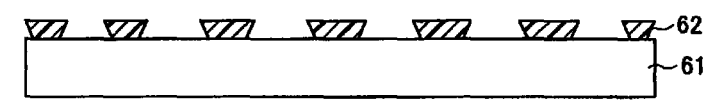
Figure 12:
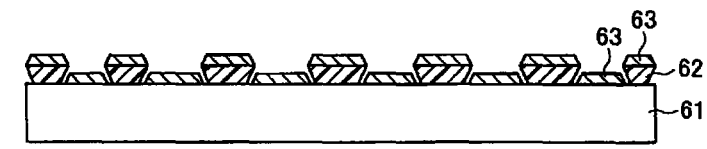
Figure 13:
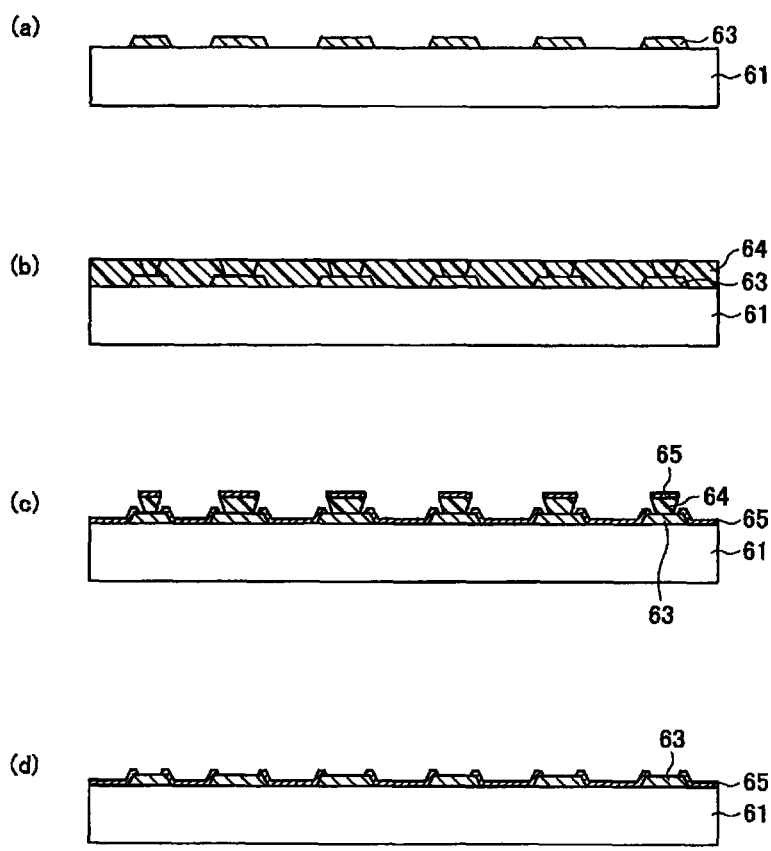
FIGS. 13(a) to 13(d) are each a cross-sectional view illustrating steps subsequent to the steps of FIG. 12 and illustrating a diagrammatic configuration of an electronic circuit.

According to the manufacturing method of the invention, since the thin film layer is covered by the adhesive layer and/or the protective layer, the thin film layer is protected from oxidation or corrosion. For example, a PDP front plate or rear plate has a configuration in which an $SnO_2$ film is formed as a protective layer on a top face of a laminated electrode layer (for example, Cr/Cu/Cr) and a dielectric layer is further formed thereon. A conventional manufacturing method is a method in which after forming a laminated electrode layer on a glass substrate, a resist layer is formed thereon, and after exposure, development and electrode layer wet etching steps, desired electrode patterning is carried out. Accordingly, as illustrated in FIG. 10(*e*), the Cu layer is exposed in the side face portion of the laminated electrode layer, and the Cu layer is oxidized or corroded in the subsequent high-temperature process. On the other hand, according to the manufacturing method of the invention, since the side face of the laminated electrode layer can be covered by the adhesive layer and/or the protective layer, deterioration due to oxidation of the laminated electrode layer or a reaction with the dielectric layer can be inhibited, and therefore, such is very favorable.

Such a configuration having a protective layer on a laminated electrode layer can be easily realized by the manufacturing method of the invention. Specifically, for example, a resist is coated on a substrate, and after carrying out exposure and development as described above, Cr as an adhesive layer, Cu as an electrode layer and $SnO_2$ as a protective layer are formed, respectively. Then, by lifting off a thin film layer made of $Cr/Cu/Sr/SnO_2$ together with the resist layer, a desired electrode pattern in which the side face of the Cu layer is covered by the adhesive layer made of Cr and the protective layer made of $SnO_2$ is obtained.

Further, as another manufacturing method, the foregoing configuration having a protective layer on a laminated electrode layer can also be obtained in a method as described below with reference to FIGS. 8 and 9. In this method, a pattern of the protective layer made of $SnO_2$ is different from the pattern of the laminated electrode layer.

FIG. 8(a) is a diagrammatic cross-sectional view illustrating a product in which a laminated electrode layer is formed on a top face of a substrate 100 by the manufacturing method of the invention. A pattern is formed on the top face of the substrate 100. The pattern is composed of a low-reflection layer 101 containing $Cr_2O_3$ as a major component and a laminated electrode layer made of Cr/Cu/Cr (adhesive layer 102 containing Cr as a major component/electrode layer 103 containing Cu as a major component/adhesive layer 104 containing Cr as a major component). FIG. 8(b) is a diagrammatic cross-sectional view of a product obtained by carrying out the resist step and the opening forming step with respect to the product obtained in FIG. 8(a) and then further carrying out the protective layer forming step. A resist layer 105 having an opening formed therein and protective layers 106 and 107 are formed. FIG. 8(c) is a diagrammatic cross-sectional view of a product obtained by further carrying out the peeling-off step with respect to the product obtained in FIG. 8(b). A top face and a side face of the laminated electrode layer are covered by the protective layer 106. According to the method as illustrated in the foregoing FIGS. 8(a) to 8(c), a product in which a pattern of the protective layer made of $SnO_2$ is different from the pattern of the laminated electrode layer can be manufactured.

FIG. 9(a) is a diagrammatic cross-sectional view illustrating a product in which a laminated electrode layer is formed on a top face of a substrate 110 by the manufacturing method of the invention. A pattern is formed on the top face of the substrate 110. The pattern is composed of a low-reflection layer 111 containing $Cr_2O_3$ as a major component and a laminated electrode layer made of Cr/Cu/Cr (adhesive layer 112 containing Cr as a major component/electrode layer 113 containing Cu as a major component/adhesive layer 114 containing Cr as a major component). FIG. 9(b) is a diagrammatic cross-sectional view of a product in which a protective layer 115 is further formed on the entire surface of the top face of the product obtained in FIG. 9(a). FIG. 9(c) is a view (diagrammatic cross-sectional view) illustrating a product in which a desired pattern of a protective layer is formed on the product obtained in FIG. 9(b) by means of laser patterning using YAG laser or the like. The method using laser patterning is preferable in view of the point that it requires only a single lift-off step. In the product thus obtained, the top face and the side face of the laminated electrode layer are covered by the protective layer 115. According to the method as illustrated in FIGS. 9(a) to 9(c), a product in which a pattern of the protective layer made of $SnO_2$ is different from the pattern of the laminated electrode layer can be manufactured.

Figure 8:
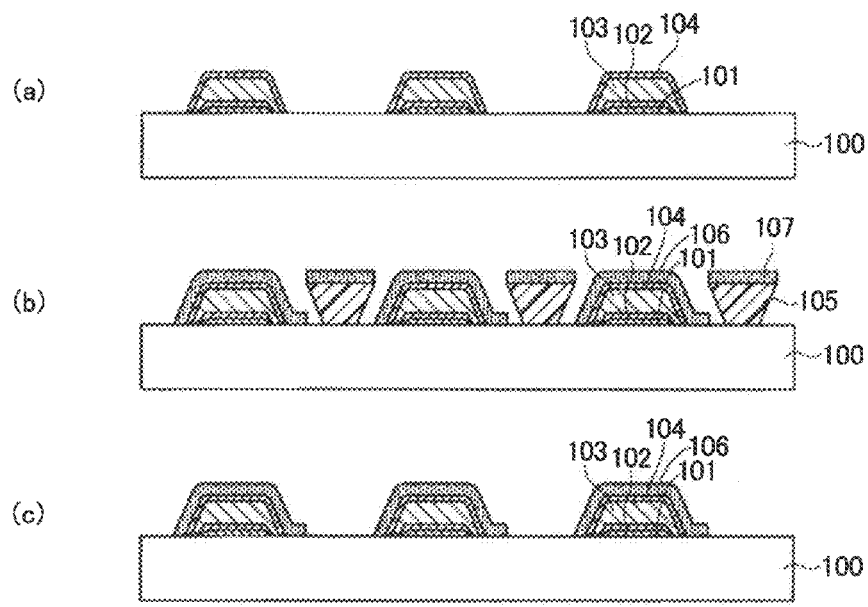
FIGS. 8(a) to 8(c) are each a diagrammatic cross-sectional view illustrating a preferred embodiment of the circuit pattern-provided substrate of the invention.
Figure 9:
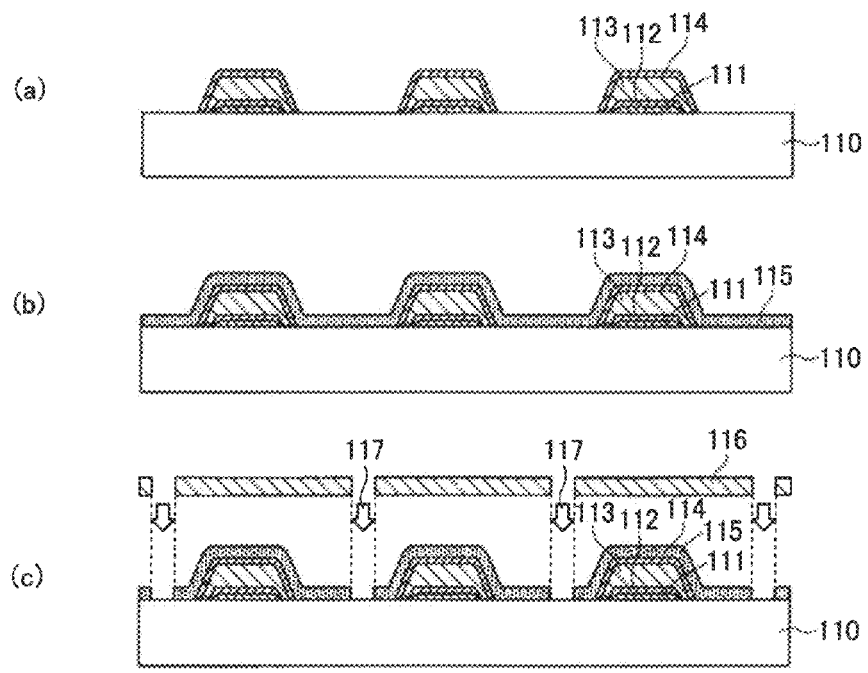
FIGS. 9(a) to 9(c) are each a diagrammatic cross-sectional view illustrating a preferred embodiment of the circuit pattern-provided substrate of the invention.

For example, the dielectric layer as illustrated in FIGS. 6 and 7 can be specifically formed in the following method after forming the protective layer by the method as shown in FIG. 8 or 9. By employing the foregoing screen printing method, a glass dielectric frit paste is printed with a desired pattern (for example, as illustrated in FIG. 7, a plasma discharge portion is covered by a dielectric (B-a), whereas an external take-out portion of electrode is not covered (B-b)), coated and baked at a high temperature. At that time, as illustrated in FIGS. 6 and 7, the Cu layer which heavily suffers from oxidation or corrosion is completely covered by the Cr adhesive layer or the $SnO_2$ protective layer, and therefore, it is possible to secure each of a lower part of the dielectric and the external take-out portion of electrode which is not covered by a dielectric in a stable state.

As described above, the manufacturing method of the invention includes the resist layer forming step, the opening forming step, the thin film layer forming step and the peeling-off step. Then, the manufacturing method of the invention is preferably a method for manufacturing a circuit pattern-provided substrate including at least one step selected from the group consisting of the protective layer forming step, the low-reflection layer forming step and the second thin film layer forming step.

As described above, the manufacturing method of the invention may include a plural number of each of the resist layer forming step, the opening forming step and the peeling-off step. Similarly, the manufacturing method of the invention may include a plural number of each of the thin film layer forming step, the protective layer forming step, the low-reflection layer forming step and the second thin film layer forming step. Furthermore, other steps, for example, a step of forming other thin film layer, an adhesion-decreasing step for making it easy to peel off the resist layer before the resist layer forming step, or the like may be included.

A circuit pattern-provided substrate can be manufactured by the foregoing manufacturing method of the invention.

Then, a PDP front substrate and a PDP rear substrate can be manufactured using this circuit pattern-provided substrate. Furthermore, a PDP front substrate and a PDP rear substrate can be manufactured by such a manufacturing method of the invention. Further, PDP is obtainable using such a PDP front substrate and/or PDP rear substrate.

Though the circuit pattern-provided substrate according to the manufacturing method of the invention can be favorably used for the manufacture of a plasma display panel, needless to say, it is also favorably applicable to similar displays or electronic circuits other than the plasma display panel. Also, as to the shape of the pattern, it is similarly applicable to a relatively small and thin pattern or a larger and thick pattern.

EXAMPLES

The invention is hereunder described with reference to Examples 1 to 10, but it should not be construed that the invention is limited to the following Examples.

Example 1

A glass substrate of 100 mm square and 2.8 mm thickness (a trade name: PD200, manufactured by Asahi Glass Co., Ltd.) is prepared as a substrate. Then, a resist film (manufactured by Tokyo Ohka Kogyo Co., Ltd.) was laminated onto the surface of this substrate, thereby forming a resist layer. This resist layer had a thickness of 25 μm and a saturated exposure amount of 80 $mJ/cm^2$.

Subsequently, the resist layer of this resist layer-provided substrate was processed in a method the same as the method as described above with reference to FIG. 3, thereby forming an opening. Specifically, by using a super-high pressure mercury vapor lamp as an exposure light source, the resist layer was first exposed through the mask 40 provided with a complete light-shielding part and a complete transmission part and having a mask pattern of line/space of 30/270 μm capable of shielding exposure light to the opening forming site J and the boundary site K, and then exposed using the mask 42 provided with a complete light-shielding part and a complete transmission part and having a mask pattern of line/space of 25/275 μm capable of shielding only exposure light to the opening forming site J. At that time, an accumulated exposure amount to the opening forming site J was set to be 0, an accumulated exposure amount to the boundary site K was set to be 100 mJ/cm$^2$, and an accumulated exposure amount to the opening non-forming site L was set to be 200 mJ/cm$^2$, namely, 0%, 125% and 250%, respectively, relative to the saturated exposure amount.

After the exposure, development is carried out using a 1% sodium carbonate alkaline aqueous solution. The development temperature was set to be 30° C., and the development time was set to be 2 times the break point which is the time until the resist layer in a non-exposed area elutes to expose the substrate surface.

According to this, an opening having a cross-sectional shape of an eaves type having a space as illustrated in FIG. 1 could be formed on the resist layer having a thickness of 25 μm. This opening had an opening size 2a of 21.8 μm and a width 2b of 30.0 μm, and the space had a height h of 1.1 μm and a width w of 2.0 μm. The formed cross-sectional shape was observed and measured using a scanning electron microscope (SEM).

Subsequently, a thin film layer is formed on the substrate and on the resist layer having an opening. First of all, a Cr layer having a film thickness of 100 nm is formed using a Cr pellet (purity: 99.99% by mass) under an inert atmosphere of argon by an ion plating method. Subsequently, a Cu layer having a film thickness of 1,000 nm is laminated on this Cr layer in the same method, except for using a Cu pellet (purity: 99.99% by mass); and a Cr layer having a film thickness of 100 nm is further formed on the Cu layer in the same method. According to this, a thin film layer (laminated electrode layer) in which an adhesive layer composed of a Cr layer, an electrode layer composed of a Cu layer and an adhesive layer composed of a Cr layer are laminated is formed.

After forming the thin film layer, the cross section of the opening of the resist layer was observed using a scanning electron scope. As a result, the thickness T of the thin film layer was 1.2 μm, whereas the thickness τ of the thin film layer at an inlet of the eaves type space of the resist layer (a point going down vertically to the thin film layer from the boundary line of the resist end face and the eaves bottom face) was 0.13 μm, and the incursion distance d to the space was 0.33 μm (the incursion film thickness at this position is several nm).

Subsequently, the resist layer and the thin film formed on the resist layer were peeled off from the substrate. Specifically, the peeling-off step was carried out by spray injecting a 3% sodium hydroxide aqueous solution heated at 50° C. from a full-cone nozzle under a pressure of 0.2 MPa for 60 seconds.

The circuit pattern-provided substrate obtained by the foregoing method had favorable precision because the incursion distance d of the thin film layer to the eaves space of the resist layer was very small as 0.33 μm. Further, in the formed circuit pattern, the cross-sectional shape is a trapezoid; the thin film layer is laminated in a stratiform state; and furthermore, the side face of the electrode layer made of Cu is covered by the adhesive layer made of Cr and is not exposed. Further, at the end of the circuit pattern, a space against the substrate or remaining of resist was not produced, and peeling was not caused.

Example 2

Similar to Example 1, a resist pattern having the same opening is formed on a substrate; and subsequently, a low-reflection layer made of chromium oxide and having a film thickness of 50 nm is formed on the substrate and the resist layer having an opening. The chromium oxide layer can be formed using a Cr pellet (purity: 99.99%) under an oxygen-containing atmosphere by an ion plating method.

Subsequently, a thin film layer having a three-layer configuration (laminated electrode layer) in which an adhesive layer composed of a Cr layer, an electrode layer composed of a Cu layer and an adhesive layer composed of a Cr layer are laminated is formed. The formation method and configuration condition of the thin film layer are the same as in Example 1, except for changing the thickness of the electrode layer composed of a Cu layer to 2,800 nm.

Subsequently, the same peeling-off step as in Example 1 is carried out, thereby obtaining a circuit pattern-provided substrate of Example 2. In the obtained circuit pattern, the thickness of the low-reflection layer at the center in the horizontal direction of the thin film layer is 50 nm; the thickness T of the thin film layer is 3.0 μm; and the thickness τ is 0.32 μm. Further, the incursion distance d is as very small as 0.4 μm (the incursion film thickness at this position is several nm), and favorable precision is revealed. Further, in the formed circuit pattern, the cross-sectional shape was a trapezoid; the respective thin film layers were laminated in a stratiform state; and furthermore, the side face of the electrode layer made of Cu was covered by the adhesive layer made of Cr and was not exposed. Further, at the end of the circuit pattern, a space against the substrate or remaining of resist was not produced, and peeling was not caused.

Example 3

Similar to Example 1, a resist film is laminated onto a substrate, thereby forming a resist layer.

Figure 4:
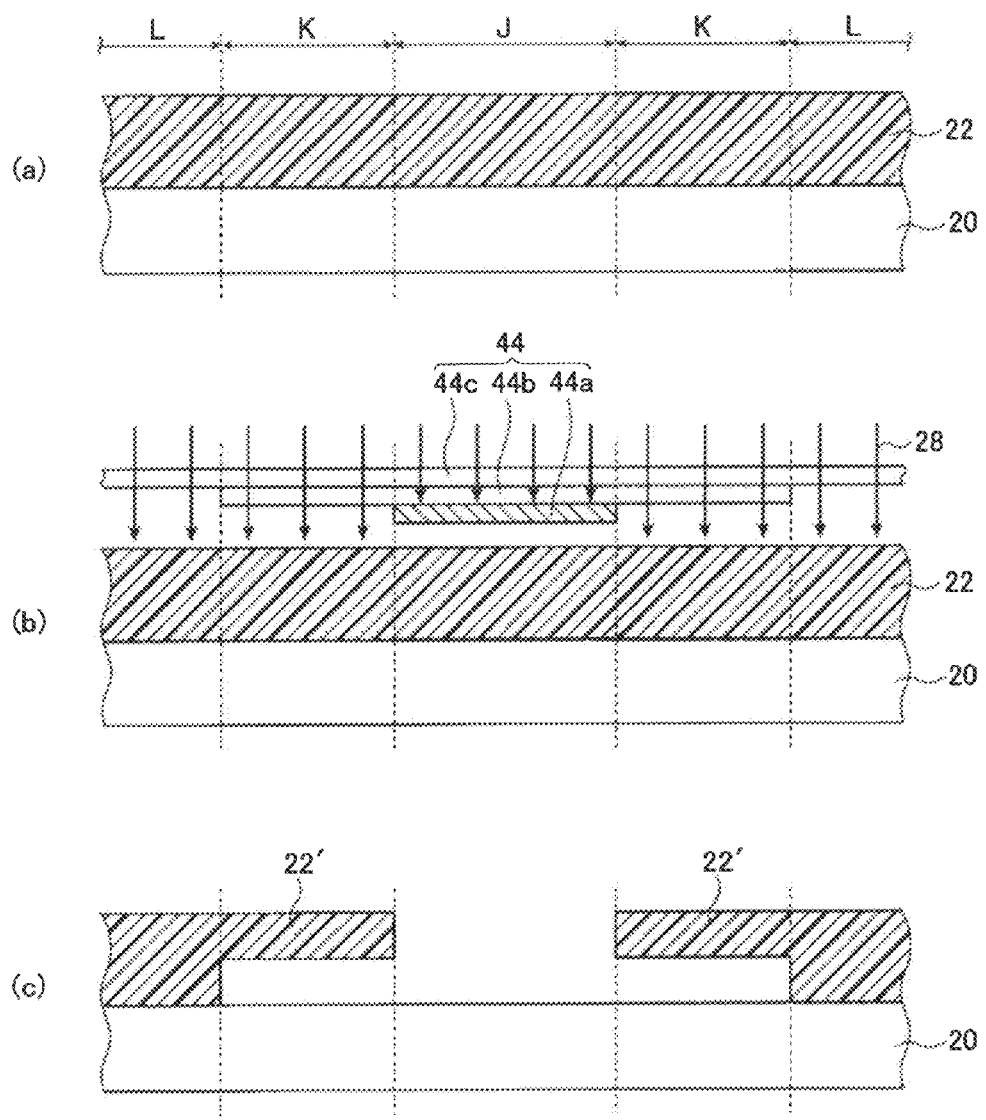
FIGS. 4(a) to 4(c) are each a diagrammatic cross-sectional view for explaining another opening forming method in the resist opening forming step of the method for manufacturing a circuit pattern-provided substrate of the invention.

An opening is formed on this resist in the method as illustrate in FIG. 4. Specifically, by using the same super-high pressure mercury vapor lamp as in Example 1, the resist layer is exposed using the mask 44 provided with a line/space pattern of a 25 μm-wide complete light-shielding part (exposure light transmittance: 0%) and having on the both sides thereof a 2.5 μm-wide semi-transmission part (exposure light transmittance: 45%) and a 270 μm-wide complete transmission part (exposure light transmittance: 90%), and subjected to the same development treatment as in Example 1, thereby forming an opening. The exposure amounts to the opening forming site J, the boundary site K and the opening non-forming site L are set to be 0 mJ/cm$^2$, 100 mJ/cm$^2$ and 200 mJ/cm$^2$, respectively. The development condition and water washing condition are the same as in Example 1.

According to this, an opening having a cross-sectional shape of an eaves type having a space as illustrated in FIG. 1 can be formed on the resist layer having a thickness of 25 μm. This opening has an opening size 2a of 22.0 μm and a width 2b of 30.0 μm, and the space has a height h of 1.2 μm and a width w of 2.2 μm. The formed cross-sectional shape can be observed and measured using a scanning electron microscope (SEM).

Subsequently, a low-reflection layer having a film thickness of 50 nm is formed on the substrate and the resist layer having an opening in the same manner as in Example 2.

Subsequently, a thin film layer having a three-layer configuration (laminated electrode layer) in which an adhesive layer composed of a Cr layer, an electrode layer composed of a Cu layer and an adhesive layer composed of a Cr layer are laminated is formed on the low-reflection layer in the same manner as in Example 2.

The composition and thickness of each layer are the same as in Example 2.

Furthermore, a protective layer containing $SnO_2$ as a major component is laminated on the adhesive layer serving as a topmost face of the thin film layer (laminated electrode layer). The protective layer containing $SnO_2$ as a major component is formed using a target containing 97% by mass of $SnO_2$ and 3% by mass of Ta under an argon atmosphere having 1% of oxygen added therein by a sputtering method and the thickness is set to be 200 nm.

Subsequently, the resist layer and the thin film layer formed on the resist layer and composed of the low-reflection layer, the thin film layer (electrode layer) and the protective layer are peeled off from the substrate in the same manner as in Example 2.

In the circuit pattern-provided substrate of Example 3 obtained by the foregoing method, the thickness of the low-reflection layer at the center in the horizontal direction of the thin film layer is 50 nm; the thickness T of the thin film layer is 3.0 μm; the thickness of the protective layer 200 nm; and the thickness τ is 0.4 μm. Further, the incursion distance d is as very small as 0.4 μm (the incursion film thickness at this position is several nm), and favorable precision is revealed. Further, in the formed circuit pattern, the cross-sectional shape is a trapezoid; the respective thin film layers are laminated in a stratiform state; and furthermore, the side face of the electrode layer made of Cu is covered by the adhesive layer made of Cr and is not exposed. A top face and a side face of the laminated electrode layer are covered by the protective layer containing $SnO_2$ as a major component and are not exposed. Further, at the end of the circuit pattern, a space against the substrate or remaining of resist is not produced, and peeling is not caused.

Example 4

Furthermore, a dielectric paste comprising low-melting glass and an organic solvent containing cellulose is printed in desired thickness and pattern on the top face of the circuit pattern-provided substrate obtained in Example 2, and heated and sintered in air at 600° C. At that time, the thickness of the dielectric film after sintering is 20 μm.

In the dielectric layer-laminated circuit pattern-provided substrate of Example 4, deterioration due to corrosion of the electrode layer by the dielectric film or lowering of conductivity or the generation of bubbles in the dielectric, which have been problems accompanied with the conventional methods, are not caused. Further, favorable characteristics are obtained at the coating boundary of the dielectric layer as illustrated in FIG. 7.

Example 5

A dielectric layer having a thickness of 18 μm is further formed and laminated on the circuit pattern of the circuit pattern-provided substrate of Example 3 in the same manner as in Example 4. In the dielectric layer-laminated circuit pattern-provided substrate of this Example, deterioration due to corrosion of the electrode layer by the dielectric film or lowering of conductivity or the generation of bubbles in the dielectric, which have been problems accompanied with the conventional methods, are not caused. Further, favorable characteristics are obtained at the coating boundary of the dielectric layer as illustrated in FIG. 7.

Example 6

A resist layer of a resist layer-provided glass substrate prepared in the same manner as in Example 1 was exposed in the same manner as in Example 1, except that an accumulated exposure amount to the opening forming site J was set to be 0 $mJ/cm^2$, an accumulated exposure amount to the boundary site K was set to be 25 $mJ/cm^2$, and an accumulated exposure amount to the opening non-forming site L was set to be 50 $mJ/cm^2$, namely, 0%, 32% and 63%, respectively, relative to the saturated exposure amount. Thereafter, development was carried out using a 1% sodium carbonate alkaline aqueous solution at a development temperature of 30° C. for a development time of 2.5 times the break point.

According to this, an opening as illustrated in FIG. 1 could be formed on the resist layer having a thickness of 25 μm. This opening had a cross-sectional shape in which the opening size 2a was 32.0 μm, the width 2b was 37.0 μm, and the space of an eaves type had a height h of 7.0 μm and a width w of 8.0 μm.

Subsequently, similar to Example 1, a thin film layer having a three-layer configuration (laminated electrode layer) in which an adhesive layer composed of a Cr layer and having a film thickness of 100 nm, an electrode layer composed of a Cu layer and having a film thickness of 1,000 nm and an adhesive layer composed of a Cr layer and having a film thickness of 100 nm were laminated and having a thickness T of 1.2 μm was formed on the substrate and on the resist layer having an opening.

In the formed thin film layer, the thickness τ of the thin film layer at an inlet of the eaves type space of the resist layer (a point going down vertically to the thin film layer from the boundary line of the resist end face and the eaves bottom face) was 0.13 μm, and the incursion distance d to the space was 0.33 μm (the incursion film thickness at this position is several nm).

Subsequently, the same peeling-off step as in Example 1 was carried out, thereby obtaining a circuit pattern-provided substrate of this Example. The circuit pattern-provided substrate of this Example had favorable precision because the incursion distance d of the thin film layer to the eaves space of the resist layer was as very small as 0.33 μm. Further, in the formed circuit pattern, the cross-sectional shape was a trapezoid; the thin film layer was laminated in a stratiform state; and furthermore, the side face of the electrode layer made of Cu was covered by the adhesive layer made of Cr and was not exposed. Further, at the end of the circuit pattern, a space against the substrate or remaining of resist was not produced, and peeling was not caused.

Example 7

In a resist layer of a resist layer-provided substrate formed in the same manner as in Example 1, an opening was formed in the same manner as in Example 3, except that the exposure amounts to the opening forming site J, the boundary site K and the opening non-forming site L were set to be 0 $mJ/cm^2$, 20 $mJ/cm^2$ and 25 $mJ/cm^2$, respectively.

According to this, an opening as illustrated in FIG. 1 could be formed on the resist layer having a thickness of 25 μm. This opening had a cross-sectional shape in which the opening size 2a was 32.0 μm, the width 2b was 37.0 μm, and the space of an eaves type had a height h of 10.0 μm and a width w of 11.0 μm.

Subsequently, a thin film layer having a film thickness of 0.1 μm and containing $SnO_2$ as a major component, which is a transparent electrode layer, was formed on the substrate and on the resist layer having an opening. The transparent electrode layer containing $SnO_2$ as a major component was formed using a target containing 97% by mass of $SnO_2$ and 3% by mass of Ta under an argon atmosphere having 1% of oxygen added therein by a sputtering method.

Subsequently, the resist layer and the thin film layer formed on the resist layer were peeled off from the substrate in the same manner as in Example 1.

In the circuit pattern-provided substrate of this Example obtained in the foregoing method, the thickness T of the thin film layer was 0.1 μm, and τ was not more than 0.05 μm. Further, the incursion distance d was as very small as 4.0 μm (the incursion film thickness at this position is several nm), and favorable precision was revealed. Further, in the formed circuit pattern, the cross-sectional shape was a trapezoid; and at the end of the circuit pattern, a space against the substrate or remaining of resist was not produced, and peeling was not caused.

Example 8

By using the same super-high pressure mercury vapor lamp as in Example 1, a resist layer of a resist layer-provided substrate obtained in the same manner as in Example 1 was exposed through a mask having a mask pattern of line/space of 30/270 μm in a light-shielding part and a transmission part. At that time, the exposure amount to the opening non-forming site was set to be 150 mJ/cm$^2$, namely 188% of the saturated exposure amount; the exposure amount to the boundary site was set to be 40 mJ/cm$^2$, namely 50% of the saturated exposure amount; and the exposure amount to the opening forming site was set to be 0 mJ/cm$^2$, namely 0% of the saturated exposure amount. Further, at the time of exposure, the distance between the resist layer and the mask was set to be 75 μm, and the inclination of an incident angle of exposure light against the normal line direction of the substrate face was set to be 2.5°.

Subsequently, development was carried out using a 1% sodium carbonate aqueous solution. A developing solution temperature was set to be 30° C., and a development time was set to be 3 times the break point. Subsequently, water washing was carried out using washing water of 0.01% by mass of calcium chloride added in pure water.

The obtained opening had a cross-sectional shape in which the opening size 2a was 27.0 μm, the width 2b was 30.0 μm, and the space of an eaves type had a height h of 2.0 μm and a width w of 4.0 μm.

Subsequently, a thin film layer composed of Cr layer/Cu layer/Cr layer was formed on the glass substrate of the opening and the resist layer in the same manner, except for changing the film thickness of the Cu layer to 2,800 nm and the thickness T of the three-layer configuration to 3 μm, respectively. The thickness T of the thin film layer at an inlet of the eaves type space of the resist layer (the point going down vertically to the thin film layer from the boundary line of the resist end face and the eaves bottom face) was 0.7 μm, and the incursion distance d to the space was 2.0 μm (the incursion film thickness at this position is several nm).

Subsequently, the peeling-off step of peeling off the resist layer and the thin film layer formed on the resist layer from the substrate was carried out in the same manner as in Example 1.

The circuit pattern-provided substrate obtained by the foregoing method had favorable precision because the incursion distance d of the thin film layer to the eaves space of the resist layer was as very small as 2.0 μm. Further, in the formed circuit pattern, the cross-sectional shape was a trapezoid; the thin film layer was laminated in a stratiform state; and furthermore, the side face of the electrode layer made of Cu was covered by the adhesive layer made of Cr and was not exposed. Further, a space or remaining of resist and peeling were not observed between the end of the circuit pattern and the substrate.

Example 9

With respect to a resist layer of a resist layer-provided substrate formed in the same manner as in Example 1, the exposure amount to the opening non-forming site was set to be 30 mJ/cm$^2$, namely 38% of the saturated exposure amount; the exposure amount to the boundary site was set to be 16 mJ/cm$^2$, namely 20% of the saturated exposure amount; and the exposure amount to the opening forming site was set to be 0 mJ/cm$^2$, namely 0% of the saturated exposure amount, respectively. Further, exposure was carried out in the same manner as in Example 8, except that at the time of exposure, the distance between the resist layer and the mask was set to be 75 μm, and the inclination of an incident angle of exposure light against the normal line direction of the substrate face was set to be 2.5°. Subsequently, development and water washing were carried out in the same manner as in Example 8, except that the developing solution temperature was set to be 15° C. and that the development time was set to be 6 times the break point. The obtained opening had a cross-sectional shape in which the opening size 2a was 31.0 μm, the width 2b was 38.0 μm, and the space of an eaves type had a height h of 1.5 μm and a width w of 3.0 μm.

Subsequently, a Cr layer having a film thickness of 100 nm, a Cu layer having a film thickness of 2,800 nm and a Cr layer thin film layer having a film thickness of 100 nm were formed in this order on the glass substrate in the opening and on the resist layer in the same manner as in Example 1, thereby forming a thin film layer having a three-layer configuration of Cr layer/Cu layer/Cr layer and having a thickness T of 3.0 μm. The thickness τ of the thin film layer at an inlet of the eaves type space of the resist layer (the point going down vertically to the thin film layer from the boundary line of the resist end face and the eaves bottom face) was 0.05 μm, and the incursion distance d to the space was 1.5 μm (the incursion film thickness at this position is several nm).

Subsequently, brush washing was carried out using a 3% sodium hydroxide aqueous solution heated at 50° C., thereby peeling off the resist layer and the thin film layer formed on the resist layer from the substrate (peeling-off step), thereby obtaining a circuit pattern-provided substrate.

The obtained circuit pattern-provided substrate had favorable precision because the incursion distance d of the thin film layer to the eaves space of the resist layer was as very small as 1.5 μm. Further, in the formed circuit pattern, the cross-sectional shape was a trapezoid; the thin film layer was laminated in a stratiform state; and furthermore, the side face of the electrode layer made of Cr and Cu was covered by the adhesive layer made of Cr and was not exposed. Further, at the end of the circuit pattern, a space against the substrate or remaining of resist was not produced, and peeling was not caused.

Example 10

With respect to a resist layer of a resist layer-provided substrate formed in the same manner as in Example 1, the exposure amount to the opening non-forming site was set to be 50 mJ/cm$^2$, namely 63% of the saturated exposure amount; the exposure amount to the boundary site was set to be 20 mJ/cm$^2$, namely 25% of the saturated exposure amount; and the exposure amount to the opening forming site was set to be 0 mJ/cm$^2$, namely 0% of the saturated exposure amount, respectively. Further, exposure was carried out in the same manner as in Example 8, except that at the time of exposure, the distance between the resist layer and the mask was set to be 75 μm, and the inclination of an incident angle of exposure light against the normal line direction of the substrate face was set to be 2.5°. Subsequently, an opening was formed in the resist layer by carrying out development and water washing in the same manner as in Example 8, except that a 0.1% sodium carbonate aqueous solution was used as the developing solution and that the development time was set to be 6 times the break point.

The obtained opening had a cross-sectional shape in which the opening size $2a$ was 27.0 μm, the width $2b$ was 35.0 μm, and the space of an eaves type had a height h of 2.0 μm and a width w of 4.0 μm.

Subsequently, an $SnO_2$ layer having a film thickness T of 0.2 μm was formed on the glass substrate in the opening and on the resist layer. The thickness τ of the thin film layer at an inlet of the eaves type space of the resist layer (the point going down vertically to the thin film layer from the boundary line of the resist end face and the eaves bottom face) was 0.06 μm, and the incursion distance d to the space was 1.8 μm (the incursion film thickness at this position is several nm).

Subsequently, the resist layer and the thin film layer formed on the resist layer were peeled off from the substrate (peeling-off step) in the same manner as in Example 7, thereby obtaining a circuit pattern-provided substrate.

The obtained circuit pattern-provided substrate had favorable precision because the incursion distance d of the thin film layer to the eaves space of the resist layer was as very small as 1.8 μm. Further, in the formed circuit pattern, the cross-sectional shape was a trapezoid, and at the end of the circuit pattern, a space against the substrate or remaining of resist is not produced, and peeling is not caused.

While the invention has been described in detail and with reference to specific embodiments thereof, it will be apparent to one skilled in the art that various changes and modifications can be made therein without departing from the spirit and scope thereof.

This application is based on Japanese Patent Application No. 2006-210835 filed Aug. 2, 2006 and Japanese Patent Application No. 2007-193567 filed Jul. 25, 2007, and the contents thereof are herein incorporated by reference.

INDUSTRIAL APPLICABILITY

According to the invention, it is possible to provide a method for manufacturing a circuit pattern-provided substrate capable of forming a desired fine circuit pattern in higher precision. Accordingly, in particular, the invention can be favorably used in an electronic circuit device which is required to have high integration (realization of high definition).

The invention claimed is:

1. A method for manufacturing a circuit pattern-provided substrate, comprising:
   forming a resist layer on a substrate;
   forming an opening corresponding to a circuit pattern and having an eaves cross-sectional shape in the resist layer;
   forming a thin film layer having a portion formed on the substrate in the opening and a portion formed on the resist layer; and
   removing the resist layer such that the resist layer and the portion of the thin film layer formed on the resist layer are removed from the substrate,
   wherein the forming of the opening comprises exposing the resist layer with a mask device configured to change an exposure amount of the resist layer such that the eaves cross-sectional shape has a space at a boundary between the resist layer and the substrate, the opening and the thin film layer satisfy relationships of $0.06 \times T \leq h \leq 0.67 \times (2c)$ and $h/4 < w \leq (2c)/6$, where h is a height of the space of the eaves cross-sectional shape, w is a width of the space of the eaves cross-sectional shape, T is a thickness of the portion of the thin film layer formed on the substrate, and $2c$ is a gap between adjacent openings, the opening is formed in a plurality in the forming of the opening, and the portion of the thin film layer formed on the substrate is formed in a plurality in the forming of the thin film layer.

2. The method for manufacturing a circuit pattern-provided substrate according to claim 1, wherein the eaves cross-sectional shape of the opening in the resist layer has an inverse tapered portion above the space.

3. The method for manufacturing a circuit pattern-provided substrate according to claim 1, wherein the forming of the opening comprises carrying out exposure and development so as to satisfy a relationship of $P<R<Q$, where P, Q and R represent exposure amounts to an opening forming site, an opening non-forming site and a boundary site, the boundary site serving as a boundary region of the opening forming and opening non-forming sites, in the resist layer, respectively.

4. The method for manufacturing a circuit pattern-provided substrate according to claim 3, wherein the exposure is carried out so as to satisfy the relationship of $P<R<Q$ by using the mask device comprising a mask which shields exposure light to the opening forming site and the boundary site and a mask which shields exposure light to the opening forming site.

5. The method for manufacturing a circuit pattern-provided substrate according to claim 3, wherein the exposure is carried out so as to satisfy the relationship of $P<R<Q$ by using the mask device comprising a mask which shields exposure light to the opening forming site and which semi-transmits exposure light to the boundary site.

6. The method for manufacturing a circuit pattern-provided substrate according to claim 3, wherein the exposure is carried out so as to satisfy the relationship of $P<R<Q$ by using the mask device comprising a mask which shields exposure light to the opening forming site and the boundary site and varying a distance between the mask and the resist layer.

7. The method for manufacturing a circuit pattern-provided substrate according to claim 3, wherein the exposure is carried out so as to satisfy the relationship of $P<R<Q$ by using the mask device comprising a mask which shields exposure light to the opening forming site and the boundary site, making a distance between the mask and the resist layer constant and exposing the boundary site by diffracted light and roundabout light generated in the periphery of a light-shielding part of the mask.

8. The method for manufacturing a circuit pattern-provided substrate according to any one of claim 3 to 7, wherein the forming of the opening in the resist layer comprises washing the resist layer with water containing from 0.0005 to 5% by mass of a monovalent, divalent or trivalent cation after the exposure.

9. The method for manufacturing a circuit pattern-provided substrate according to claim 1, wherein the forming of the thin film layer comprises forming an electrode layer comprising at least one member selected from the group consisting of Cu, Al, Ag and Ni as a major component or forming an electrode layer comprising at least one member selected from the group consisting of $SnO_2$, ITO and ZnO as a major component.

10. The method for manufacturing a circuit pattern-provided substrate according to claim 9, wherein the forming of the thin film layer comprises forming an electrode layer comprising Cu as a major component, a layer comprising at least one of Cr and Ti as a major component on a top face of the electrode layer, and a layer comprising at least one of Cr and Ti as a major component on a bottom face of the electrode layer.

11. The method for manufacturing a circuit pattern-provided substrate according to claim 1, further comprising forming a protective layer which coves a top face and a side face of the portion of the thin film layer formed on the substrate, wherein the protective layer comprises a layer comprising at least one member selected from the group consisting of $SiO_2$, $TiO_2$, $ZrO_2$, $Ta_2O_5$, $Cr_2O_3$ and $SnO_2$ as a major component.

12. The method for manufacturing a circuit pattern-provided substrate according to claim 1, further comprising determining a height and a width of the space of the eaves cross-sectional shape such that in the forming of the thin film layer, the portion of the thin film layer formed on the substrate in the opening does not go up onto the resist layer.

13. The method for manufacturing a circuit pattern-provided substrate according to claim 1, wherein the removing of the resist layer comprises peeling off the resist layer from the substrate such that the resist layer and the portion of the thin film layer formed on the resist layer are removed from the substrate.

* * * * *